(12) United States Patent
Jang et al.

(10) Patent No.: US 10,996,778 B2
(45) Date of Patent: May 4, 2021

(54) DISPLAY APPARATUS WITH INTEGRATED TOUCH SCREEN AND METHOD FOR FABRICATING THE SAME

(71) Applicant: LG Display Co., Ltd., Seoul (KR)

(72) Inventors: Jaehyung Jang, Paju-si (KR); MinJoo Kim, Paju-si (KR); JaeWon Lee, Paju-si (KR); SangHoon Pak, Paju-si (KR); Sanghyuk Won, Paju-si (KR); Byonghoo Kim, Paju-si (KR); Sangheun Lee, Paju-si (KR); Hyangmyoung Gwon, Paju-si (KR); Jeonghoon Lee, Paju-si (KR); Sungjin Kim, Paju-si (KR); Yuna Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 32 days.

(21) Appl. No.: 16/172,343

(22) Filed: Oct. 26, 2018

(65) Prior Publication Data

US 2019/0129550 A1 May 2, 2019

(30) Foreign Application Priority Data

Oct. 30, 2017 (KR) .................... 10-2017-0142388

(51) Int. Cl.
*G06F 3/041* (2006.01)
*G06F 3/044* (2006.01)
*G06F 3/042* (2006.01)
*H01L 27/32* (2006.01)
*H01L 51/52* (2006.01)

(52) U.S. Cl.
CPC ............ *G06F 3/0412* (2013.01); *G06F 3/042* (2013.01); *G06F 3/0445* (2019.05); *G06F 3/0446* (2019.05); *H01L 27/323* (2013.01); *G06F 2203/04111* (2013.01); *G06F 2203/04112* (2013.01); *H01L 51/5253* (2013.01)

(58) Field of Classification Search
CPC .......... G06F 3/041; G06F 3/042; G06F 3/044; G06F 3/045; G06F 3/047; H01L 27/12; H01L 27/32; H01L 23/00; H01L 51/00; H01L 51/05; H01L 51/10; H01L 51/52; H01L 51/56; H01L 21/84; G02F 1/1333; G02F 1/1343; G02F 1/1335; G02F 1/1337; G02F 1/1368
See application file for complete search history.

(56) References Cited

U.S. PATENT DOCUMENTS

| | | | |
|---|---|---|---|
| 2010/0026661 A1 | 2/2010 | Teramoto | |
| 2014/0098057 A1* | 4/2014 | Lee | G06F 3/044 345/174 |
| 2014/0218631 A1* | 8/2014 | Kang | G06F 3/044 349/12 |
| 2017/0307923 A1* | 10/2017 | Hwang | G06F 3/0412 |
| 2018/0026079 A1* | 1/2018 | Lee | H01L 27/322 257/40 |

(Continued)

*Primary Examiner* — Chanh D Nguyen
*Assistant Examiner* — Nguyen H Truong
(74) *Attorney, Agent, or Firm* — Fenwick & West LLP

(57) ABSTRACT

A display apparatus comprises a light emitting device layer that includes a first electrode arranged on a first substrate, a light emitting layer arranged on the first electrode, and a second electrode arranged on the light emitting layer; and a touch sensing layer arranged on the light emitting device layer.

18 Claims, 11 Drawing Sheets

(56) References Cited

U.S. PATENT DOCUMENTS

| | | | |
|---|---|---|---|
| 2018/0039349 A1* | 2/2018 | Han | G06F 3/0412 |
| 2018/0053810 A1* | 2/2018 | Jin | H01L 51/525 |
| 2018/0197924 A1* | 7/2018 | Tada | H01L 27/323 |
| 2018/0329537 A1* | 11/2018 | Gunji | G06F 3/0418 |

* cited by examiner

DISPLAY APPARATUS WITH INTEGRATED TOUCH SCREEN AND METHOD FOR FABRICATING THE SAME

CROSS-REFERENCE TO RELATED APPLICATIONS

This application claims the benefit of the Republic of Korea Patent Application No. 10-2017-0142388 filed on Oct. 30, 2017, which is incorporated by reference in its entirety.

BACKGROUND

Technical Field

The present disclosure relates to a display apparatus with an integrated touch screen and a method for fabricating the same.

Discussion of the Related Art

With the advancement of the information age, a demand for a display apparatus for displaying an image has been increased in various forms. Therefore, various display apparatuses such as liquid crystal display (LCD) apparatuses, plasma display panel (PDP) apparatuses, and organic light emitting display (OLED) apparatuses have been used. Among the display apparatuses, the OLED apparatus has advantages of low-voltage driving, thin profile, excellent viewing angle, and rapid response speed.

The OLED apparatus may include a display panel having data lines, scan lines, and a plurality of pixels provided at every intersection of the data and scan lines, a scan driver for supplying scan signals to the scan lines, and a data driver for supplying data voltages to the data lines. Each of the pixels may include an organic light emitting device, a driving transistor for controlling the amount of a current supplied to the organic light emitting device in accordance with a voltage of a gate electrode, and a scan transistor for supplying a data voltage of the data line to the gate electrode of the driving transistor in response to a scan signal of the scan line.

Recently, the display apparatus is formed as a display apparatus with an integrated touch screen, which includes a touch screen panel for sensing a user's touch. In this case, the display apparatus functions as a touch screen apparatus. Recently, the touch screen apparatus is widely applied to home appliances such as a refrigerator, a microwave oven and a washing machine, as well as monitors for navigation, an industrial terminal, a notebook computer, a banking automation apparatus and a game console and mobile terminals such as a smart phone, tablet, mobile phone, MP3, PDA, PMP, PSP, mobile game console, DMB receiver and tablet PC. Also, the touch screen apparatus has become widely used due to its easy operation.

In the display apparatus with an integrated touch screen, first touch electrodes, second touch electrodes, and bridge electrodes for connecting the first touch electrodes or the second touch electrodes with each other are formed in the display panel. The first touch electrodes may be Tx electrodes, and the second touch electrodes may be Rx electrodes.

The first and second electrodes of the display apparatus with an integrated touch screen are formed on the same layer. If an interval between the first and second touch electrodes is not sufficient, a problem occurs in that a short is generated between the first and second electrodes due to particles generated during a process of forming touch electrodes or a scratch generated during a substrate scribing process after a cell process.

SUMMARY

Accordingly, the present disclosure is directed to a display apparatus with an integrated touch screen and a method for fabricating the same, which substantially obviate one or more problems due to limitations and disadvantages of the related art.

An advantage of the present disclosure is to provide a display apparatus with an integrated touch screen and a method for fabricating the same, in which short may be prevented from being generated between first touch electrodes and second touch electrodes.

Additional advantages and features of the disclosure will be set forth in part in the description which follows and in part will become apparent to those having ordinary skill in the art upon examination of the following or may be learned from practice. The objectives and other advantages of the disclosure may be realized and attained by the structure particularly pointed out in the written description and claims hereof as well as the appended drawings.

A display apparatus according to one embodiment of the present disclosure comprises a light emitting device layer.

In another aspect of the present disclosure, a method for fabricating a display apparatus comprises the steps of forming a thin film transistor layer.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) and together with the description serve to explain the principle of the disclosure. In the drawings.

DETAILED DESCRIPTION

Figure 1:
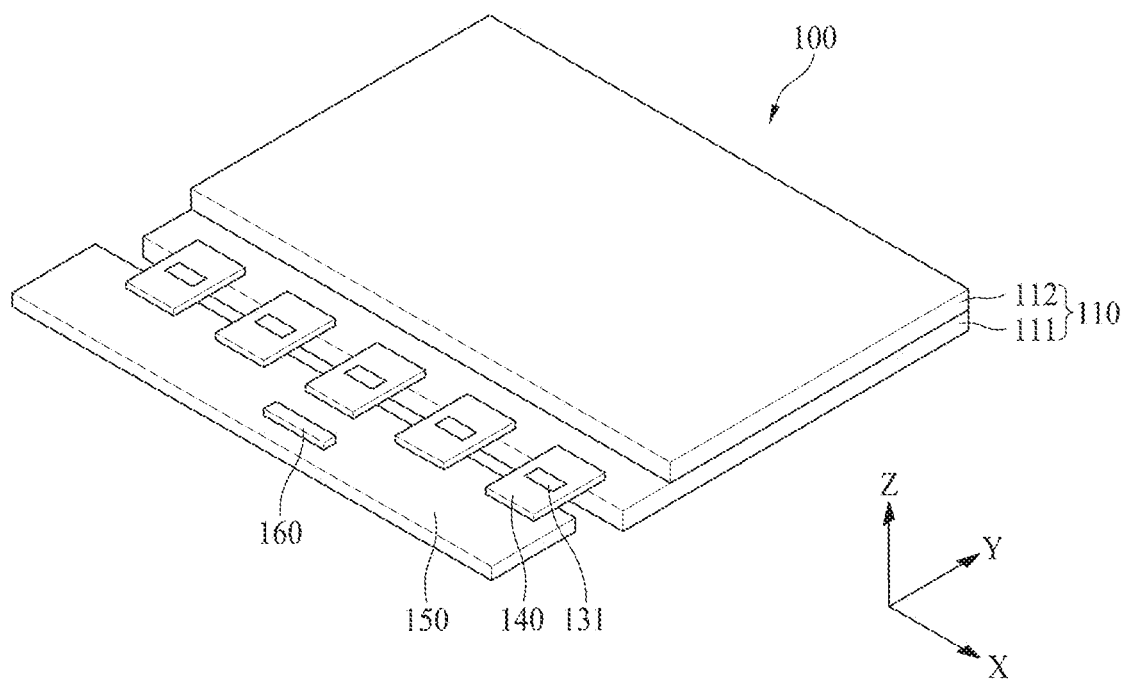
FIG. 1 is a perspective view illustrating a display apparatus with an integrated touch screen according to one embodiment.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present invention is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure.

"A first horizontal-axis direction", "a second horizontal-axis direction," and "a vertical-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings. Wherever possible, the same reference numbers will be used throughout the drawings to refer to the same or like parts.

Figure 2:
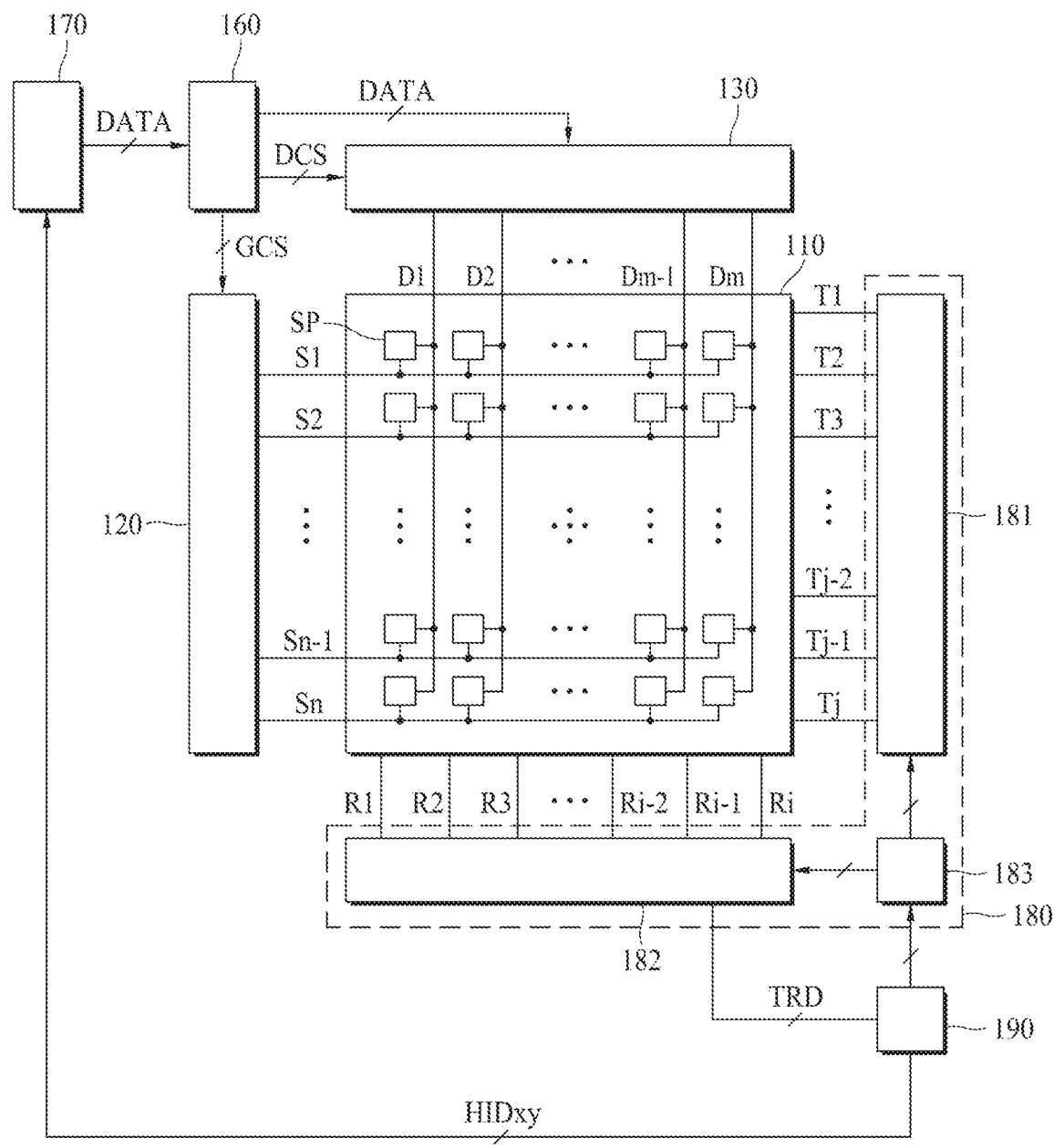
FIG. 2 is a block view illustrating a display apparatus with an integrated touch screen according to one embodiment.

FIG. 1 is a perspective view illustrating a display apparatus with an integrated touch screen according to one embodiment. FIG. 2 is a block view illustrating a display apparatus with an integrated touch screen according to one embodiment.

Referring to FIGS. 1 and 2, the display apparatus with an integrated touch screen according to an embodiment includes a display panel 110, a scan driver 120, a data driver 130, a timing controller 160, a host system 170, a touch driver 180, and a touch coordinate calculator 190.

The display apparatus with an integrated touch screen according to the present disclosure may be realized as a flat panel display apparatus such as a liquid crystal display (LCD), field emission display (FED), plasma display panel (PDP), organic light emitting display (OLED), and electrophoresis display (EPD). Hereinafter, the display apparatus with an integrated touch screen according to the present disclosure is realized as, but not limited to, an organic light emitting display apparatus.

The display panel 110 includes a first substrate 111 and a second substrate 112. The second substrate 112 may be an encapsulation substrate. The first substrate may be a plastic film or a glass substrate. The second substrate 112 may be a plastic film, a glass substrate, or an encapsulation film (protective film).

The display panel 110 includes a display area on which sub pixels SP are arranged to display an image. On the display area 110, data lines D1 to Dm (m is a positive integer of 2 or more) and scan lines S1 to Sn (n is a positive integer of 2 or more) are formed. The data lines D1 to Dm may be formed to cross the scan lines S1 to Sn. The sub pixels SP may be formed on the area defined by a crossed structure of the gate lines and the data lines.

Each of the sub pixels SP of the display panel 110 may be connected to any one of the data lines D1 to Dm and any one of the scan lines S1 to Sn. Each of the sub pixels SP of the display panel 110 may include a driving transistor for controlling a drain-source current in accordance with a data voltage applied to a gate electrode, a scan transistor turned on by a scan signal of the scan line, supplying a data voltage of the data line to the gate electrode of the driving transistor, an organic light emitting diode for emitting light in accordance with the drain-source current of the driving transistor, and a capacitor for storing a voltage of the gate electrode of the driving transistor. Therefore, each of the sub pixels SP may emit light in accordance with the current supplied to the organic light emitting diode.

The scan driver 120 receives a scan control signal GCS from the timing controller 160. The scan driver 120 supplies scan signals to the scan lines S1~Sn in accordance with the scan control signal GCS.

The scan driver 120 may be formed in a non-display area outside one side or both sides of the display area of the display panel 110 in a GIP (gate driver in panel) mode. Alternatively, the scan driver 120 is fabricated of a driving chip, packaged in a flexible film, and may be attached to the non-display area outside one side or both sides of the display area of the display panel 110 in a TAB (tape automated bonding) mode.

The data driver 130 receives digital video data DATA and a data control signal DCS from the timing controller 160. The data driver 130 converts the digital video data DATA into an analogue positive polarity/negative polarity data voltage in accordance with the data control signal DCS and supplies them to the data lines. That is, pixels to which the data voltages will be supplied are selected by the scan signals of the scan driver 120, and the data voltages are supplied to the selected pixels.

The data driver 130 may include a plurality of source drive ICs 131 as shown in FIG. 1. Each of the plurality of source drive ICs 131 may be packaged into the flexible film 140 in a COF (chip on film) or COP (chip on plastic) mode. The flexible film 140 is attached onto pads provided on the non-display area of the display panel 110 using an anisotropic conducting film, whereby the source drives ICs 131 may be connected to the pads.

The circuit board 150 may be attached to the flexible films 140. A plurality of circuits realized as driving chips may be packaged onto the circuit board 150. For example, the timing controller 160 may be packaged onto the circuit board 150. The circuit board 150 may be a printed circuit board or flexible printed circuit board.

The timing controller 160 receives digital video data DATA and timing signals from the host system 170. The timing signals may include a vertical synchronization signal, a horizontal synchronization signal, a data enable signal, and a dot clock. The vertical synchronization signal is a signal defining one frame period, according to an embodiment. The horizontal synchronization signal is a signal defining one horizontal period needed to supply the data voltages to pixels of one horizontal line of the display panel DIS, according to an embodiment. The data enable signal is a signal defining a period of inputting available data. The dot clock is a signal repeated with a predetermined short period, according to an embodiment.

In order to control operation timings of the scan driver 120 and the data driver 130, the timing controller 160 generates a data control signal DCS for controlling operation timing of the data driver 130 and a scan control signal GCS for controlling operation timing of the data driver 130 based on the timing signals. The timing controller 160 outputs the scan control signal GCS to the scan driver 120 and outputs the digital video data DATA and the data control signal DCS to the data driver 130.

The host system 170 may be realized as a navigation system, a set-top box, a DVD player, a blue-ray player, a personal computer (PC), a home theater system, a broadcasting receiver, and a phone system. The host system 170 includes SoC (System on chip) equipped with a scaler and converts the digital video data of an input image to a format suitable to display the display panel 110. The host system 170 transmits the digital video data DATA and the timing signals to the timing controller 160.

On the display panel 110, not only the data lines D1 to Dm and the scan lines S1 to Sn but also first and the second touch electrodes may be formed. The first touch electrodes may be formed to cross the second touch electrodes. The first touch electrodes may be connected to a first touch driver 181 through first touch lines T1 to Tj, where j is an integer equal to or greater than 2. The second touch electrodes may be connected to a second touch driver 182 through second touch lines R1 to Ri, where i is an integer equal to or greater than 2. On each of the intersections between the first touch electrodes and the second touch electrodes, a touch sensor may be formed. The touch sensor according to the embodiment of the present disclosure is realized as, but not limited to, a mutual capacitance. The first and the second touch electrodes will be described later in more detail with reference to FIGS. 4 and 5.

The touch driver 180 supplies a driving pulse to the first touch electrodes through the first touch lines T1 to Tj and senses the amount of charge changes in each of the touch sensors through the second touch lines R1 to Ri. That is, in FIG. 2, description will be given based on that the first touch lines T1 to Tj are Tx lines for supplying a driving pulse and the second touch lines R1 to Ri are Rx lines for sensing the amount of charge changes in in each of the touch sensors.

The touch driver 180 includes the first touch driver 181, the second touch driver 182, and a touch controller 183. The first touch driver 181, the second touch driver 182, and the touch controller 183 may be integrated into one ROIC (Read-out IC).

The first touch driver 181 selects the first touch line to output a driving pulse under the control of the touch controller 183 and supplies the driving pulse to the selected first touch line. For example, the first touch driver 181 may sequentially supply driving pulses to the first touch lines T1 to Tj.

The second touch driver 182 selects the second touch lines to receive the amount of charge changes in the touch sensors under the control of the touch controller 183 and receives the amount of charge changes in the touch sensors through the selected second touch lines. The second touch driver 182 converts the amount of charge changes in the touch sensors, which are received through the second touch lines R1 to Ri, to touch raw data TRD which is digital data by sampling the amount of charge changes in the touch sensors.

The touch controller 183 may generate a Tx setup signal in the first touch driver 181 to set up the first touch line to which the driving pulse is to be output and an Rx setup signal in the second touch driver 182 to set up the second touch line in which a touch sensor voltage is to be received. Also, the touch controller 183 generates timing control signals to control operation timings of the first touch driver 181 and the second touch driver 182.

The touch coordinate calculator 190 receives touch raw data TRD from the touch driver 180. The touch coordinate calculator 190 calculates touch coordinate(s) in accordance with a touch coordinate calculating method and outputs touch coordinate data HIDxy including information of touch coordinate(s) to the host system 170.

The touch coordinate calculator 190 may be realized as a micro controller unit (MCU). The host system 170 analyzes touch coordinate data HIDxy input from the touch coordinate calculator 190 and executes an application program connected with a coordinate where a touch is generated by a user. The host system 170 transmits the digital video data DATA and the timing signals to the timing controller 160 in accordance with the executed application program.

The touch driver 180 may be included in the source drive ICs 131 or may be fabricated of a separate drive chip and packaged onto the circuit board 150. Also, the touch coordinate calculator 190 may be fabricated of a driving chip and packaged onto the circuit board 150

Figure 3:
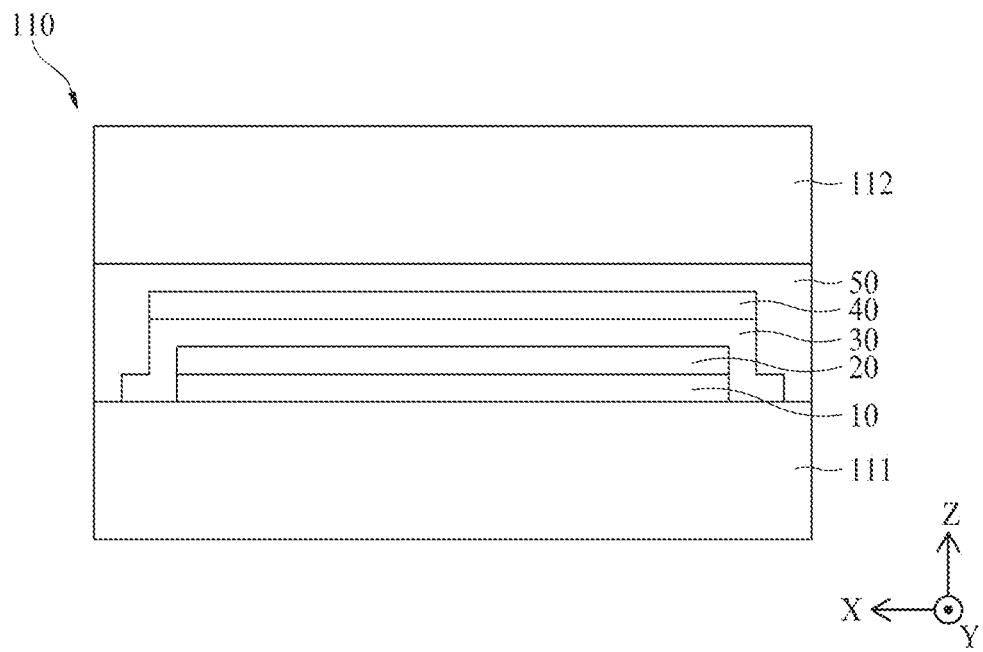
FIG. 3 is a cross-sectional view illustrating one side of a display panel of FIG. 2 according to one embodiment.

FIG. 3 is a cross-sectional view illustrating one side of the display panel in FIG. 2.

Referring to FIG. 3, the display panel 110 may include a first substrate 111, a second substrate 112, a thin film transistor layer 10 arranged between the first and second substrates 111 and 112, an organic light emitting device layer 20, an encapsulation layer 30, a touch sensing layer 40, and an adhesive layer 50.

The first substrate 111 may be a plastic film or a glass substrate.

The thin film transistor layer 10 is formed on the first substrate 111. The thin film transistor layer 10 may include scan lines, data lines, and thin film transistors. Each of the thin film transistors includes a gate electrode, a semiconductor layer, and source and drain electrodes. In the case that a scan driver is formed using a GIP (gate driver in panel) method, the scan driver may be formed together with the thin film transistor layer 10. A detailed description of the thin film transistor 10 will be given later with reference to FIGS. 6 and 7.

The organic light emitting device layer 20 is formed on the thin film transistor 10. The organic light emitting device layer 20 includes first electrodes, an organic light emitting layer, a second electrode, and banks. Each of the organic light emitting layers may include a hole transporting layer, an organic light emitting layer, and an electron transporting layer. In this case, when a voltage is applied to the first electrode and the second electrode, holes and electrons are moved to the light emitting layer through the hole transporting layer and the electron transporting layer, respectively and are combined in the organic light emitting layer, thereby emitting light. The light emitting device layer 20 may be a pixel array layer where pixels are formed, whereby the area where the organic light emitting device layer 20 is formed may be defined as the display area. An area in the periphery of the display area may be defined as the non-display area. A detailed description of the light emitting device layer 20 will be given later with reference to FIGS. 6 and 7.

The encapsulation layer 30 is formed on the organic light emitting device layer 20. The encapsulation layer 30 serves to prevent oxygen or water from being permeated into the organic light emitting device layer 20. The encapsulation layer 30 may include at least one inorganic film and at least one organic film. A sectional structure of the encapsulation layer 30 will be described later in detail with reference to FIGS. 6 and 7.

The touch sensing layer 40 is formed on the encapsulation layer 30. The touch sensing layer 40 may include first and the second touch electrode layers for sensing a touch of a user. The first touch electrode layer may include first patterned bridge electrodes connected to the first touch lines T1 to Tj and second patterned touch electrodes connected to the second touch lines R1 to Ri. The second touch electrode layer may include first patterned touch electrodes for mutually connecting the first bridge electrodes and second bridge electrodes for mutually connecting the second patterned touch electrodes. In the embodiment of the present disclosure, the touch sensing layer for sensing the touch of the user is formed on the encapsulation layer 30, whereby the touch screen apparatus does not need to be separately attached on the display apparatus. A plane structure of the touch sensing layer 40 will be described later with reference to FIGS. 4 and 5. Also, a sectional structure of the touch sensing layer 40 will be described later with reference to FIGS. 6 and 7.

The adhesive layer 50 is formed on the touch sensing layer. The adhesive layer 50 adheres the first substrate 111 and the second substrate 112 to each other, which are provided with the thin film transistor 10, the light emitting device layer 20, the encapsulation layer 30, and the touch sensing layer 40. The adhesive layer 50 may be an optically clear resin (OCR) or an optically clear adhesive film (OCA).

The second substrate 112 serves as a cover substrate or cover window for covering the first substrate 110. The second substrate 112 may be a plastic film, a glass substrate, or an encapsulation film (protective film).

Figure 4:
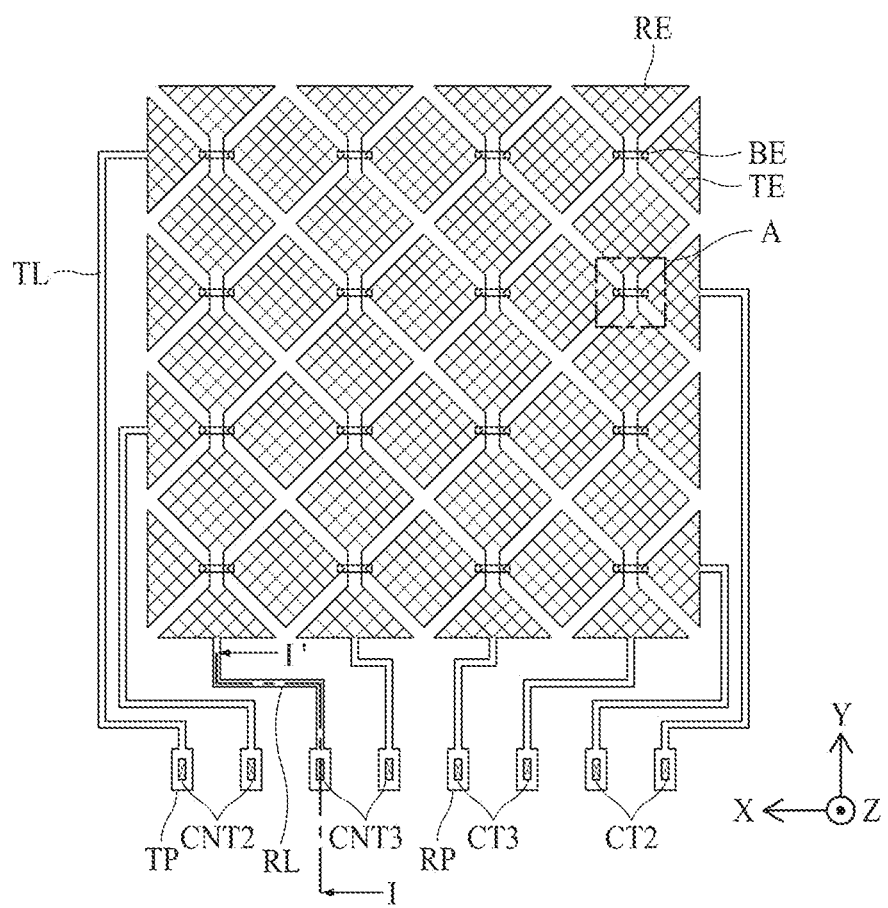
FIG. 4 is a plane view illustrating first and second touch electrodes, bridge electrodes and first and second touch lines of a display apparatus with an integrated touch screen according to one embodiment.

FIG. 4 is a plane view illustrating first and second touch electrodes, bridge electrodes, and first and second touch lines of a display apparatus with an integrated touch screen according to one embodiment.

Referring to FIG. 4, the first touch electrodes TE may be arranged in a first direction (x-axis direction), and the second touch electrodes RE may be arranged in a second direction (y-axis direction) crossing the first direction (x-axis direction). The first direction (x-axis direction) may be parallel with the scan lines S1 to Sn, and the second direction (y-axis direction) may be parallel with the data lines D1 to Dm. Alternatively, the first direction (x-axis direction) may be parallel with the data lines D1 to Dm, and the second direction (y-axis direction) may be parallel with the scan lines S1 to Sn. Although FIG. 4 illustrates that the first touch electrodes TE and the second touch electrodes RE have a diamond shaped plane structure, it is to be understood that the present disclosure is not limited to the example of FIG. 4. In one embodiment, the diamond shaped plane structures formed by the first touch electrode TE and the second touch electrode RE have side lengths of 30 μm to 40 μm.

The first touch electrodes TE adjacent to each other in the first direction (x-axis direction) may electrically be connected with each other through the bridge electrode BE to prevent the first touch electrodes TE and the second touch electrodes RE from being shorted at their crossed areas. Mutual capacitance corresponding to the touch sensor may be formed on the crossed area of the first touch electrode TE and the second touch electrode RE. The bridge electrode BE can be provided when 4 to 6 diamond shaped plane structures formed by the first touch electrode TE and the second touch electrode RE are arranged.

Also, since each of the first touch electrodes TE connected in the first direction (x-axis direction) can be spaced apart from the first touch electrodes TE adjacent thereto in the second direction (y-axis direction), the first touch electrodes can be electrically insulated from each other. Since each of the second touch electrodes RE connected in the second direction (y-axis direction) can be spaced apart from the second touch electrodes RE adjacent thereto in the first direction (x-axis direction), the second touch electrodes can be electrically insulated from each other.

Among the first touch electrodes TE connected with each other in the first direction (x-axis direction), the first touch electrode TE arranged at one end may be connected with the first touch line TL. The first touch line TL may be connected to the first touch driver 181 through a first touch pad TP. Therefore, the first touch electrodes TE connected with each other in the first direction (x-axis direction) may receive a touch driving signal from the first touch driver 181 through the first touch line TL.

Among the second touch electrodes RE connected with each other in the second direction (y-axis direction), the second touch electrode RE arranged at one end may be connected to the second touch line RL. The second touch line RL may be connected to the second touch driver 182 through a second touch pad RP. Therefore, the second touch driver 182 may receive the amount of charge changes in the touch sensors of the second touch electrodes RE connected with each other in the second direction (y-axis direction).

Figure 5:
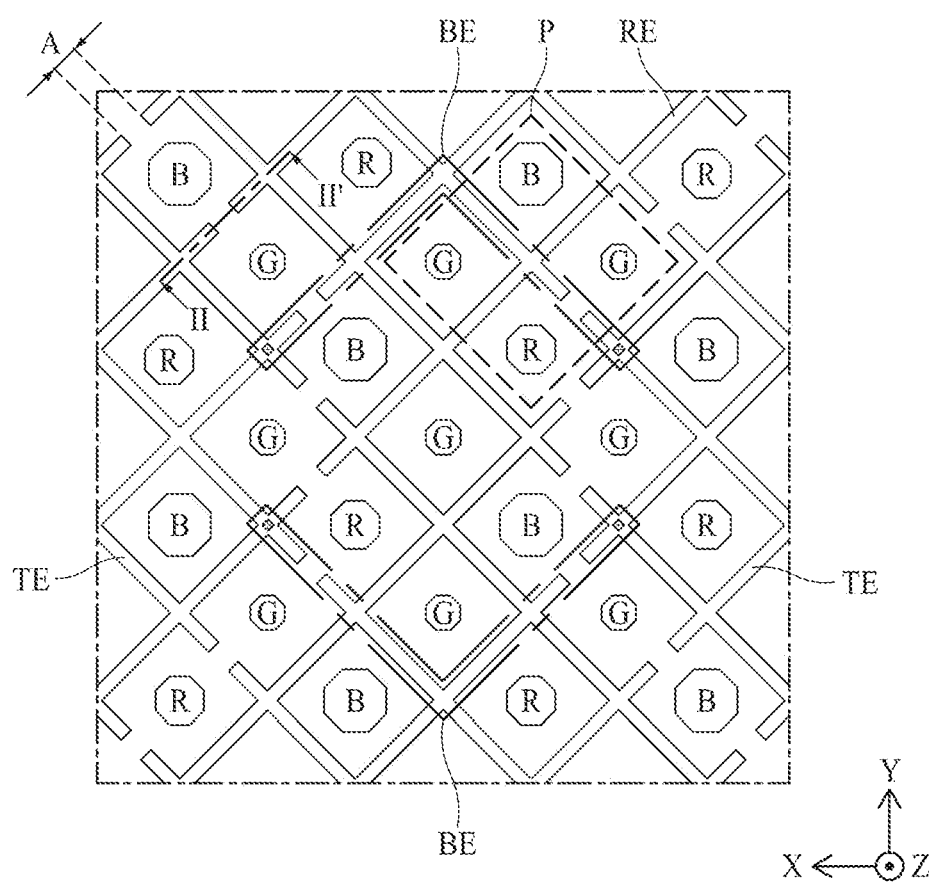
FIG. 5 is an enlarged view illustrating an area A of FIG. 4 according to one embodiment.

FIG. 5 is an enlarged view illustrating an area A of FIG. 4.

Referring to FIG. 5, pixels P may be formed in a pentile structure. Each of the pixels P includes a plurality of sub pixels SP. For example, a pixel P may include one red pixel R, two green pixels G, and one blue pixel B as shown in FIG. 5. The red pixel R, the two green pixels G and the blue pixel B may be formed in an octagonal plane shape. Also, among the red pixel R, the two green pixels G and the blue pixel B, the blue pixel B may be the greatest, and the green pixel G may be the smallest. Although FIG. 5 illustrates that the pixels are formed in a pentile structure, the embodiment of the present disclosure is not limited to the example of FIG. 5.

The first touch electrodes TE and the second touch electrodes RE may be formed in a mesh structure to be prevented from being overlapped with the red pixel R, the green pixels G and the blue pixel B of each of the pixels P. That is, the first touch electrodes TE and the second touch electrodes RE may be formed on a bank provided among the red pixel R, the green pixels G and the blue pixel B. In one embodiment, a distance between crossed points where the first touch electrodes TE cross second touch electrodes RE is 30 μm to 40 μm.

The first touch electrodes TE adjacent to each other in the first direction (x-axis direction) may be connected with each other through a plurality of bridge electrodes BE. Each of the bridge electrodes BE may be connected to the first touch electrodes TE adjacent to each other through a first connector for exposing the first touch electrodes TE. The bridge electrodes BE may be overlapped with the first touch electrode TE and the second touch electrode RE. The bridge electrode BE may be formed on the bank provided among the red pixel R, the green pixels G and the blue pixel B. Here, the bridge electrodes BE may be formed in a mesh structure. The bridge electrode BE may be formed on the bank provided among the red pixel R, the green pixels G and the blue pixel B. It may also be said that the Tx and Rx electrodes (formed respectively by the combination of first and second touch electrodes with corresponding bridge electrodes) may also be formed in a mesh structure. It may also be said that "formed in a mesh structure" refers to an electrode that has the shape, or form, of a mesh.

The first touch electrodes TE and the second touch electrodes RE may be formed on the same layer, and the bridge electrode BE may be formed on a layer different from the first touch electrodes TE and the second touch electrodes RE.

Figure 6:
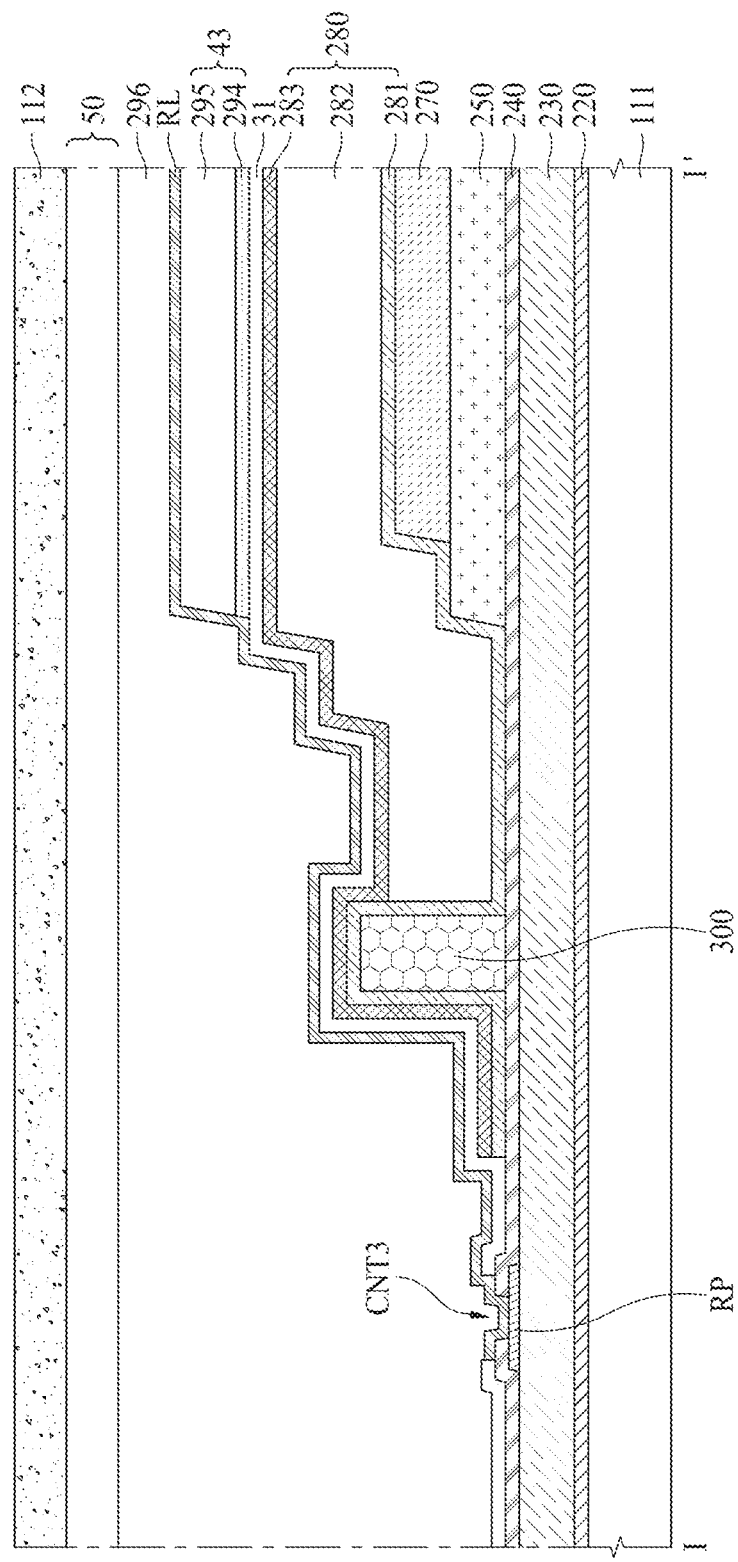
FIG. 6 is a cross-sectional view illustrating an example of I-I' of FIG. 4 according to one embodiment.
Figure 7:
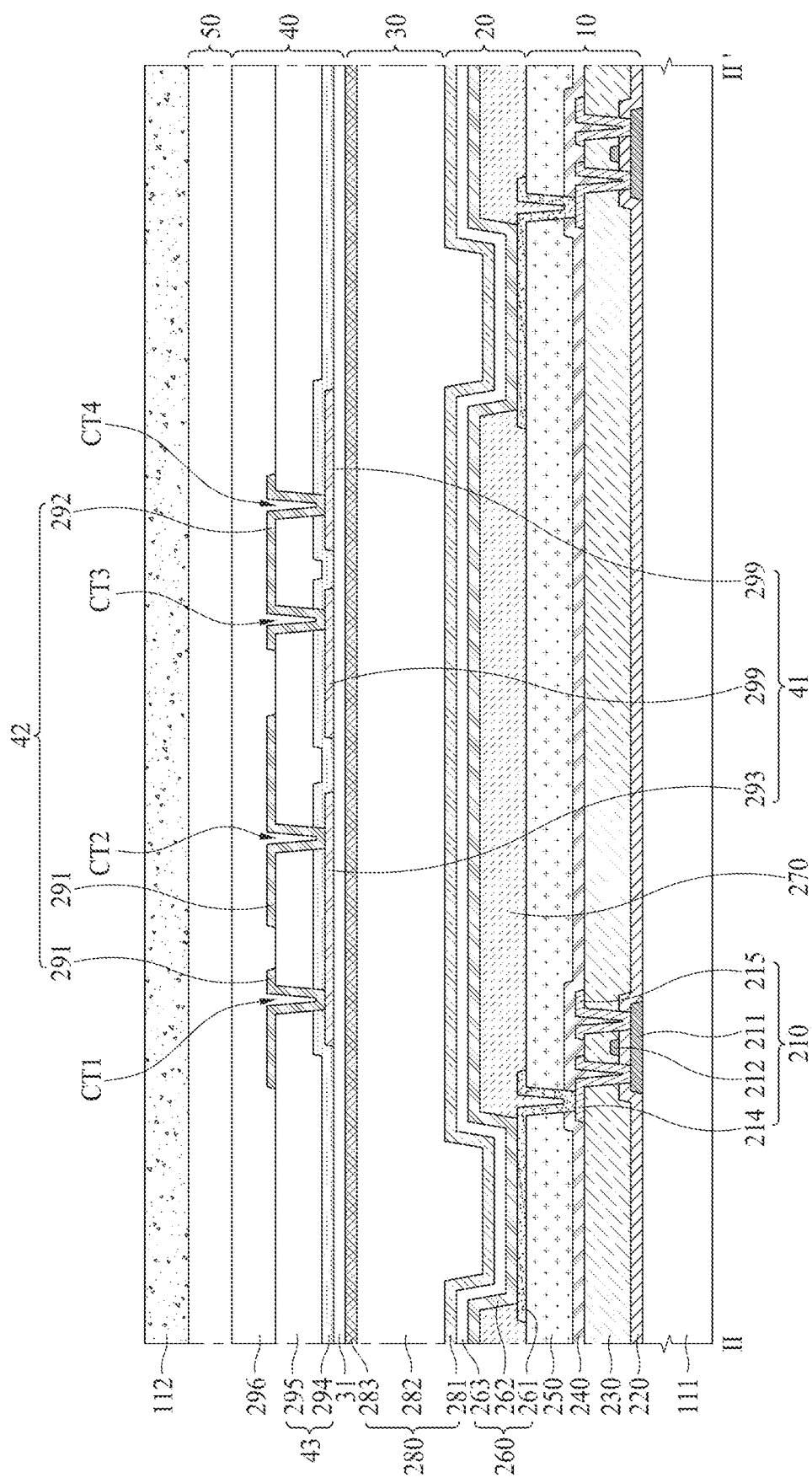
FIG. 7 is a cross-sectional view illustrating an example of II-IF of FIG. 5 according to one embodiment.

FIG. 6 is a cross-sectional view illustrating an example of I-I' of FIG. 4. FIG. 7 is a cross-sectional view illustrating an example of II-IF of FIG. 5.

A detailed connection structure of the second touch line RL and the second touch pad RP is shown in FIG. 6, and a detailed connection structure between the bridge electrode BE and the first touch electrodes TE is shown in FIG. 7.

Referring to FIGS. 6 and 7, the thin film transistor layer 10 is formed on the first substrate 111. The thin film transistor 10 includes thin film transistors 210, first and second touch pads TP (not shown) and RP, a gate insulating film 220, an inter-layer dielectric film 230, a passivation film 240, and a planarization film 250.

A first buffer film (although not shown) may be formed on one surface of the first substrate 111. The first buffer film may be formed on one surface of the first substrate 111 to protect the thin film transistors 210 and light emitting devices 260 from water permeated through the first substrate 111 which is vulnerable to moisture permeability. One surface of the first substrate 111 may be a surface facing the second substrate 112. The first buffer film may be made of a plurality of inorganic films which are deposited alternately. For example, the first buffer film may be formed of a multi-layered film of one or more inorganic films of a silicon oxide film (SiOx), a silicon nitride film (SiNx) and SiON, which are deposited alternately. The first buffer film may be omitted.

The thin film transistor 210 is formed on the first buffer film. The thin film transistor 210 includes an active layer 211, a gate electrode 212, a source electrode 215, and a drain electrode 214. Although the thin film transistor 210 is formed in a top gate mode in which the gate electrode 212 is arranged above the active layer 211 as shown in FIG. 7, it is to be understood that the thin film transistor of the present disclosure is not limited to the top gate mode. That is, the thin film transistor 210 may be formed in a bottom gate mode in which the gate electrode 212 is arranged below the active layer 211 or a double gate mode in which the gate electrode 212 is arranged above and below the active layer 211.

The active layer 211 is formed on the first buffer film. The active layer 211 may be formed of a silicon based semiconductor material or an oxide based semiconductor material. A light-shielding layer for shielding external light entering the active layer 211 may be formed between the first buffer film and the active layer 211.

The gate insulating film 220 may be formed on the active layer 211. The gate insulating film 220 may be formed of an inorganic film, for example, a silicon oxide film (SiOx), a silicon nitride film (SiNx) or a multi-layered film of the silicon oxide film and the silicon nitride film.

The gate electrode 212 and the gate line may be formed on the gate insulating film 220. The gate electrode 212 and the gate line may be formed of a single layer or multi-layer comprised of any one of Mo, Al, Cr, Au, Ti, Ni, Nd and Cu or their alloy.

The inter-layer dielectric film 230 may be formed on the gate electrode 212 and the gate line. The inter-layer dielectric film 230 may be formed of an inorganic film, for example, a silicon oxide film (SiOx), a silicon nitride film (SiNx), or a multi-layered film of the silicon oxide film and the silicon nitride film.

The source electrode 215, the drain electrode 214, the data line, and the first and second touch pads TP (not shown) and RP may be formed on the inter-layer dielectric film 230. Each of the source electrode 215 and the drain electrode 214 may be connected to the active layer 211 through a contact hole that passes through the gate insulating film 220 and the inter-layer dielectric film 230. The source electrode 215, the drain electrode 214, the data line and the first and second touch pads TP (not shown) and RP may be formed of a single layer or multi-layer comprised of any one of Mo, Al, Cr, Au, Ti, Ni, Nd and Cu or their alloy.

The passivation layer 240 may be formed on the source electrode 215, the drain electrode 214, the data line, and the first and second touch pads TP and RP to insulate the thin film transistor 210. The passivation layer 240 may be formed of an inorganic film, for example, a silicon oxide film (SiOx), a silicon nitride film (SiNx), or a multi-layered film of the silicon oxide film and the silicon nitride film.

The planarization film 250 for planarizing a step difference due to the thin film transistor 210 may be formed on the passivation layer 240. The planarization film 250 may be formed of an organic film such as acrylic resin, epoxy resin, phenolic resin, polyamide resin, and polyimide resin.

The organic light emitting device layer 20 is formed on the thin film transistor layer 10. The organic light emitting device layer 20 includes organic light emitting devices and a bank 270.

The light emitting devices and the bank 270 are formed on the planarization film 250. Each of the light emitting devices includes the first electrode 261, the organic light emitting layer 262, and the second electrode 263. The first electrode 261 may be an anode electrode, and the second electrode 263 may be a cathode electrode.

The first electrode 261 may be formed on the planarization film 250. The first electrode 261 may be connected to the source electrode 215 of the thin film transistor 210 through a contact hole that passes through the passivation film 240 and the planarization film 250. The first electrode 261 may be formed of conductive material with high reflectivity such as a deposition structure (Ti/Al/Ti) of Al and Ti, a deposition structure (ITO/Al/ITO) of Al and ITO, an APC alloy, or a deposition structure (ITO/APC/ITO) of APC alloy and ITO. The APC alloy is an alloy of Ag, Pd, and Cu.

The bank 270 may be formed on the planarization film 250 to partition the first electrode 261, thereby serving as a pixel defining film to define sub pixels SP, according to an embodiment. The bank 270 may be formed to cover an edge of the first electrode 261.

Each of the sub pixels P denotes an area where the first electrode 261 corresponding to the anode electrode, the light emitting layer 262, and the second electrode 263 corresponding to the cathode electrode are sequentially deposited and holes from the first electrode 261 and electrons from the second electrode 263 are combined with each other in the light emitting layer 262 to emit light.

The organic light emitting layer 262 is formed on the first electrode 261 and the bank 270. The organic light emitting layer 262 may be an organic light emitting layer for emitting a predetermined color including an organic material. If the organic light emitting layer 262 is a white light emitting layer for emitting white light, the organic light emitting layer 262 may be a common layer commonly formed for the pixels P. In this case, the organic light emitting layer 262 may be formed in a tandem structure of two stacks or more. Each of the stacks may include a hole transporting layer, at least one light emitting layer, and an electron transporting layer.

Also, a charge generating layer may be formed between the stacks. The charge generating layer may include an n type charge generating layer arranged to adjoin the lower stack, and a p type charge generating layer formed on the n type charge generating layer and arranged to adjoin the upper stack. The n type charge generating layer injects electrons into the lower stack, and the p type charge generating layer injects holes into the upper stack. The n type charge generating layer may be an organic layer of an organic host material doped with alkali metal such as Li, Na, K, or Cs, or alkali earth metal such as Mg, Sr, Ba or Ra, wherein the organic host material has electron transporting capability. The p type charge generating layer may be an organic layer of an organic host material doped with a dopant, wherein the organic host material has hole transportation capability.

The second electrode 263 is arranged on the organic light emitting layer 262. The second electrode 263 may be formed to cover the organic light emitting layer 262. The second electrode 263 may be a common layer commonly formed for the pixels P.

The second electrode 263 may be formed of a transparent conductive material (TCO) such as ITO and IZO, which may transmit light, or a semi-transmissive conductive material such as Mg, Ag, and alloy of Mg and Ag. If the second electrode 263 is formed of a semi-transmissive conductive material, light emission efficiency may be enhanced by a micro cavity. A capping layer may be formed on the second electrode 263.

The encapsulation layer 30 is formed on the light emitting device layer 20. The encapsulation layer 30 includes an encapsulation film 280.

The encapsulation film 280 is arranged on the second electrode 263. The encapsulation film 280 may include at least one inorganic film and at least one organic film to prevent oxygen or water from being permeated into the light emitting layer 262 and the second electrode 263. For example, the encapsulation film 280 may include first and second inorganic films 281 and 283 and an organic film 282 interposed between the first and second inorganic films 281 and 283 as shown in FIGS. 6 and 7. Each of the first and second inorganic films 281 and 283 may be formed of a silicon nitride, an aluminum nitride, a zirconium nitride, a titanium nitride, a hafnium nitride, a tantalum nitride, silicon oxide, an aluminum oxide, or a titanium oxide. The organic film 282 may be formed with a sufficient thickness, for example, 7 µm to 8 µm, to prevent particles from being permeated into the light emitting layer 262 and the second electrode 263 by passing through the encapsulation film 280.

Since a flow of the organic film 282 is blocked by a dam 300, the organic film 282 may be formed inside the dam 300. By contrast, the first and second inorganic films 281 and 283 may be formed outside the dam 300. Also, the first and second inorganic films 281 and 283 may be formed so as not to cover the first and second touch pads TP (not shown) and RP.

A second buffer film 31 is formed on the encapsulation layer 30. The second buffer film 31 may be formed to cover the encapsulation film 280 and the first and second touch pads TP (not shown) and RP. The second buffer film 31 may be formed of an inorganic film or an organic film. If the second buffer film 31 is formed of an inorganic film, the second buffer film 31 may be formed of a silicon oxide film (SiOx), a silicon nitride film (SiNx) or a multi-layered film of the silicon oxide film and the silicon nitride film.

A touch sensing layer 40 is formed on the second buffer film 31. The touch sensing layer 40 includes a first touch electrode layer 41, a second touch electrode layer 42, and a touch insulating film 43.

The first touch electrode layer 41 includes first bridge electrodes 293 and second patterned touch electrode 299. The second touch electrode layer 42 includes first patterned touch electrodes 291 and second bridge electrodes 292. The first patterned touch electrodes and the second bridge electrodes 291 and 292 may be arranged on the same layer. The first patterned touch electrodes and second bridge electrodes 291 and 292 are spaced apart from each other, and are electrically insulated from each other. The touch insulating film 43 includes a touch inorganic film 294 and a touch organic film 295. Here, each of the first bridge electrode 293, the first patterned touch electrode 291, the second bridge electrode 292, and the second patterned touch electrode 299 may be formed in a mesh structure. The bridge electrode BE overlap with at least one of the first bridge electrodes 293, the first patterned touch electrodes 291, the second bridge electrodes 292, and the second patterned touch electrodes 299

In more detail, the first bridge electrodes 293 and the second patterned touch electrodes 299 may be formed on the second buffer film 31. The first bridge electrodes 293 and the second patterned touch electrodes 299 are patterned on the second buffer film 31. The first bridge electrodes 293 connect the first patterned touch electrodes 291 with each other, and the second patterned touch electrodes 299 are connected with the second bridge electrodes 292. It may be said that electrodes or elements that are "patterned" refers to any configuration in which said electrode or element has a predetermined shape. It may also be said that an element that is patterned "in a plurality of patterns" refers to an element that is present in a number of discrete parts. Alternatively, it may also be said that an element that is patterned "as one pattern" refers to when an element is unitary, or does not have discrete parts.

The first bridge electrodes 293 and the second patterned touch electrodes 299 may be formed of a single layer or multi-layer comprised of any one of Mo, Al, Cr, Au, Ti, Ni, Nd and Cu or their alloy.

The touch inorganic film 294 may be formed on the first bridge electrodes 293 and the second patterned touch electrodes 299. The touch inorganic film 294 may be formed of an inorganic film, for example, a silicon oxide film (SiOx), a silicon nitride film (SiNx) or a multi-layered film of the silicon oxide film and the silicon nitride film.

The touch organic film 295 may be formed on the touch inorganic film 294. The organic film 282 of the encapsulation film 280 is a particle cover layer for preventing particles from being permeated into the light emitting layer 262 and the second electrode 263 by passing through the encapsulation film 280, whereas the touch organic film 295 is a layer for spacing the first touch electrode layer 41 and the second touch electrode layer 42 apart from each other at a predetermined distance. Therefore, the touch organic film 295 may be formed at a thickness thinner than that of the organic film 282 of the encapsulation film 280. For example, the touch organic film 295 may be formed at a thickness of 2 μm, approximately. Also, since contact holes are not formed in the organic film 282 of the encapsulation film 280, the organic film 282 of the encapsulation film 280 does not need to include a photoresist material. By contrast, since contact holes are formed in the touch organic film 295, the touch organic film 295 may include a photoresist material. For example, the touch organic film 295 may be formed of a photo acrylate that includes a photoresist material.

The first patterned touch electrodes 291 and the second bridge electrodes 292 are formed on the touch organic film 295. The first patterned touch electrodes 291 may be transmitter (Tx) electrodes, and the second bridge electrodes 292 may be receiver (Rx) electrodes. The first patterned touch electrodes 291 and the second bridge electrodes 292 may be patterned.

The first patterned touch electrodes 291 may be connected with the first bridge electrodes 293 through first and second contact holes CT1 and CT2 provided to pass through the touch inorganic film 294 and the touch organic film 295.

The first contact hole CT1 connects the pattern of the first patterned touch electrode 291 at a left side with one side of the first bridge electrode 293. The second contact hole CT2 connects the pattern of the first patterned touch electrode 291 at a center portion with the other side of the first bridge electrode 293.

In this case, since the first patterned touch electrodes 291 are connected using the first bridge electrodes 293 at their crossed areas, the first bridge electrodes 293 connected with the first patterned touch electrodes 291 form one Tx electrode.

The second bridge electrodes 292 may be connected with the second patterned touch electrodes 299 through third and fourth contact holes CT3 and CT4 provided to pass through the touch inorganic film 294 and the touch organic film 295. Since the second bridge electrodes 292 are connected with the second patterned touch electrodes 299, the second patterned touch electrodes 299 connected with the second bridge electrodes 292 form one Rx electrode.

The first touch line TL may be extended from the first patterned touch electrode 291, and the second touch line RL may be extended from the second bridge electrode 292. The first touch line TL may be connected with the first touch pad TP through a second connector CNT2 provided to pass through the passivation film 240 and the buffer film 31. The second touch line RL may be connected with the second touch pad RP through a third connector CNT3 provided to pass through the passivation film 240 and the buffer film 31. It is noted that the first, second, third, etc. labels are intended to keep the respective elements (touch lines, connectors, etc.) consistent with the figures, and are not functionally limiting beyond distinguishing these features from one another.

The first patterned touch electrodes 291, the second bridge electrodes 292, the first touch lines TL and the second touch lines RL may be formed of a single layer or multi-layer comprised of any one of Mo, Al, Cr, Au, Ti, Ni, Nd and Cu or their alloy.

An overcoat layer 296 for planarizing a step difference caused by the first patterned touch electrodes 291, the second bridge electrodes 292, the first bridge electrodes 293, and the second patterned touch electrodes 299 may be formed on the first patterned touch electrodes 291 and the second bridge electrodes 292.

Meanwhile, although FIG. 7 illustrates that the first touch electrode layer 41 is formed on the second buffer film 31, the touch insulating film 43 is formed on the first touch electrode layer 41, and the second touch electrode layer 42 is formed on the touch insulating film 43, the present disclosure is not limited to the example of FIG. 7. That is, the second touch electrode layer 42 may be formed on the second buffer film 31, the touch insulating film 43 may be formed on the second touch electrode layer 42, and the first touch electrode layer 41 may be formed on the touch insulating film 43.

A color filter layer may be formed on the touch sensing layer 40. The color filter layer may include color filters arranged to overlap the sub pixels SP and a black matrix arranged to overlap the bank 270. If the light emitting layer 262 includes organic light emitting layers for emitting red light, green light, and blue light, the color filter layer may be omitted.

An adhesive layer 50 is formed on the touch sensing layer 40. The adhesive layer 50 adheres the first substrate 111 and the second substrate 112 to each other, which are provided with the thin film transistor 10, the light emitting device layer 20, the encapsulation layer 30, and the touch sensing layer 40. The adhesive layer 50 may be an optically clear resin (OCR) or an optically clear adhesive film (OCA).

The second substrate 112 serves as a cover substrate or cover window for covering the first substrate 110. The second substrate 112 may be a plastic film, a glass substrate, or an encapsulation film (protective film).

In the display apparatus with an integrated touch screen according to one embodiment of the present disclosure, the first bridge electrodes 293 and the second patterned touch electrodes 299 are formed to be patterned. The first bridge electrode 293 for connecting the first patterned touch electrodes 291 with each other may be formed as one pattern. The second patterned touch electrode 299 for connecting the second bridge electrode 292 with each other may be formed as one pattern. The first bridge electrode 293 connected with one first patterned touch electrode 291 may be formed of a plurality of patterns. The second patterned touch electrode 299 connected with one second bridge electrode 292 may be formed of a plurality of patterns. FIG. 7 illustrates that the first patterned touch electrode 291 is formed of two patterns and the first bridge electrode 293 for connecting the first patterned touch electrodes 291 with each other is formed of one pattern. Also, FIG. 7 illustrates that the second patterned touch electrode 299 connected with the one second bridge electrode 292 is formed of two patterns.

Therefore, the first patterned touch electrode 291 is formed of two patterns, and the first bridge electrode 293 for connecting the first patterned touch electrodes 291 with each other is formed of one pattern, whereby one Tx electrode is formed. Also, the second patterned touch electrodes 299 connected with the one second bridge electrode 292 is formed of two patterns, whereby one Rx electrode is formed.

Since the Tx electrode includes the first bridge electrode 293 and the first patterned touch electrode 291, and the Rx electrode includes the first patterned touch electrode 299 and the second bridge electrode 292, the Tx electrode and the Rx electrode are arranged in a deposition structure of two layers. The first bridge electrode 293 and the first patterned touch electrode 291, or the second patterned touch electrodes 299 and the second bridge electrode 292 are connected with each other through a plurality of contact holes CT1 to CT4.

The first patterned touch electrode 291 and the second bridge electrode 292 are arranged to be spaced apart from each other. The first patterned touch electrode 291 constituting the Tx electrode and the second bridge electrode 292 constituting the Rx electrode are arranged on the same layer. If the first patterned touch electrode 291 and the second bridge electrode 292, which are arranged on the same layer, are adjacent to each other, signal interference between the Tx electrode and the Rx electrode may be generated, and parasitic capacitance may be generated between the Tx electrode and the Rx electrode. Therefore, if the first patterned touch electrode 291 and the second bridge electrode 292 are spaced apart from each other, signal interference and parasitic capacitance may be avoided.

The first bridge electrode 293 connected with the first patterned touch electrode 291 and the second patterned touch electrode 299 connected with the second bridge electrode 292 are arranged to be spaced apart from each other. The first bridge electrode 293 constituting the Tx electrode and the second patterned touch electrode 299 constituting the Rx electrode are arranged on the same layer. Therefore, the first bridge electrode 293 connected with the first patterned touch electrode 291 and the second patterned touch electrode 299 connected with the second bridge electrode 292 are arranged on the same layer. If the first bridge electrode 293 connected with the first patterned touch electrode 291 and the second patterned touch electrode 299 connected with the second bridge electrode 292, which are arranged on the same layer, are adjacent to each other, signal interference between the Tx electrode and the Rx electrode may be generated, and parasitic capacitance may be generated between the Tx electrode and the Rx electrode. Therefore, the first bridge electrode 293 constituting the Tx electrode and the second patterned touch electrode 299 constituting the Rx electrode are spaced apart from each other, whereby signal interference and parasitic capacitance may be avoided.

As described above, FIG. 7 illustrates that the first patterned touch electrode 291 is formed of two patterns and the first bridge electrode 293 for connecting the first patterned touch electrodes 291 with each other is formed of one pattern. Also, FIG. 7 illustrates that the second patterned touch electrode 299 connected with the one second bridge electrode 292 is formed of two patterns.

In this case, the distance between the first patterned touch electrode 291 constituting the Tx electrode and the second patterned touch electrode 299 constituting the Tx electrode is shorter than the distance between the first patterned touch electrode 291 constituting the Tx electrode and the second bridge electrode 292 constituting the Tx electrode.

The first patterned touch electrode 291 is formed on the same layer as that of the second bridge electrode 292, whereas the first patterned touch electrode 291 is formed on a layer different from that of the second patterned touch electrode 299. Therefore, if the distance between the first patterned touch electrode 291 and the second bridge electrode 292 is short, it is more affected by signal interference and parasitic capacitance. If the distance between the first patterned touch electrode 291 and the second patterned touch electrode 299, which are formed on their respective layers different from each other, becomes relatively short, this case may reduce signal interference or parasitic capacitance as compared with the case that the first patterned touch electrode 291 and the second bridge electrode 292 are formed of a single layer. In this case, the first patterned touch electrode 291 may overlap with the second patterned touch electrode 299 as shown in FIG. 7 or the first patterned touch electrode 291 and the second patterned touch electrode 299 have a gap (A) as shown in FIG. 5.

Figure 8:
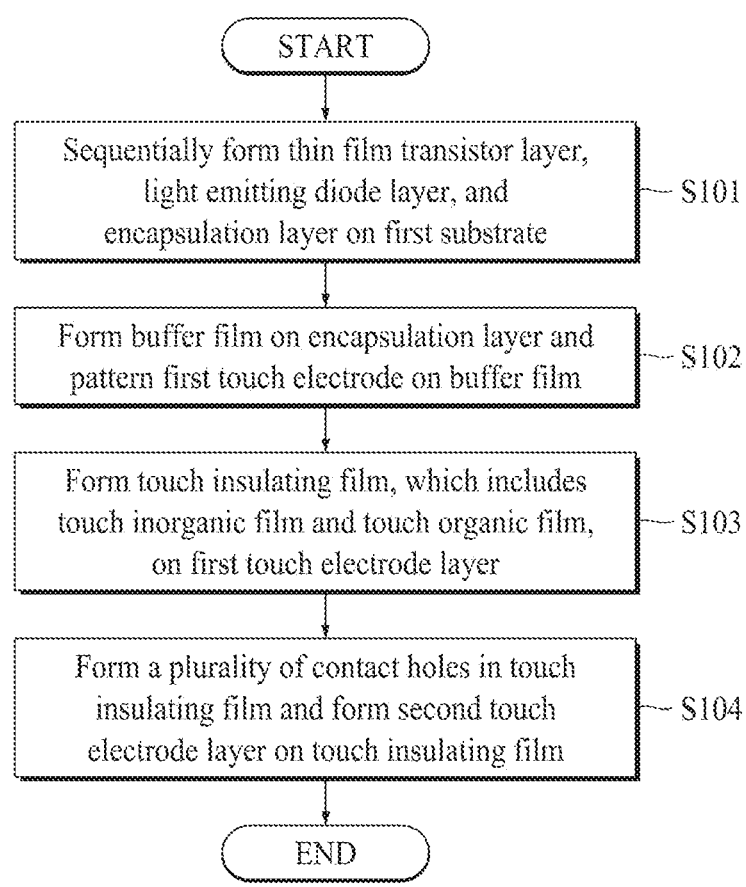
FIG. 8 is a flow chart illustrating a method for fabricating a display apparatus with an integrated touch screen according to one embodiment.

FIG. 8 is a flow chart illustrating a method for fabricating a display apparatus with an integrated touch screen according to one embodiment of the present disclosure, and FIGS. 9 to 12 are cross-sectional views illustrating a method for fabricating a display apparatus with an integrated touch screen according to one embodiment of the present disclosure. It is to be noted that the sectional views of II-IF of FIG. 5, which are shown in FIG. 7, are shown in FIGS. 9 to 12.

Hereinafter, a method for fabricating a display apparatus with an integrated touch screen according to one embodiment of the present disclosure will be described in detail with reference to FIGS. 8 to 12.

Figure 9:
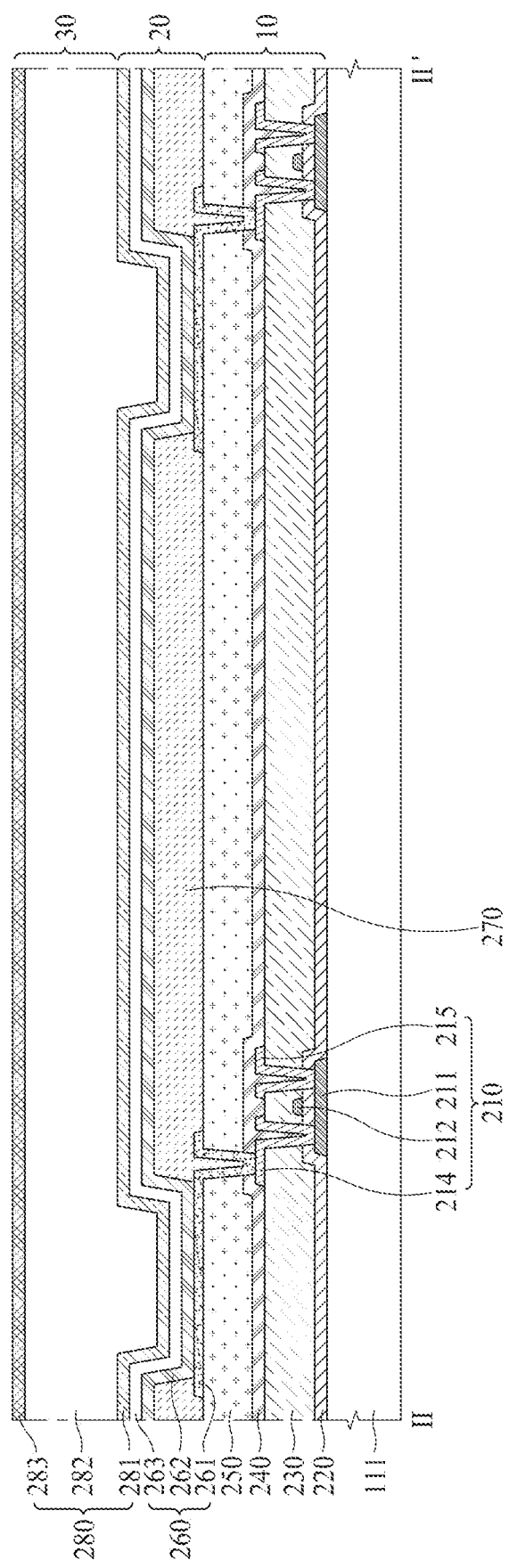
FIGS. 9 to 12 are cross-sectional views illustrating a method for fabricating a display device with an integrated touch screen according to one embodiment.

First of all, as shown in FIG. 9, the thin film transistor layer 10, the light emitting device layer 20 and the encapsulation layer 30 are formed on the first substrate 111 (S101 of FIG. 8).

In more detail, the first buffer film may be formed on the first substrate 111 from water permeated through the substrate 100 before the thin film transistor is formed. The first buffer film is intended to protect the thin film transistor 210 and the organic light emitting device 260 from water permeated through the first substrate 111 which is vulnerable to moisture permeability, and may be made of a plurality of inorganic films which are deposited alternately. For example, the first buffer film may be formed of a multi-layered film of one or more inorganic films of a silicon oxide film (SiOx), a silicon nitride film (SiNx) and SiON, which are deposited alternately. The first buffer film may be formed using a CVD (Chemical Vapor Deposition) method.

Afterwards, the active layer 211 of the thin film transistor is formed on the first buffer film. Specifically, an active metal layer is formed on the entire surface of the first buffer film using a sputtering method or a MOVCD (metal organic chemical vapor deposition) method. Then, the active metal layer is patterned by a mask process using a photoresist pattern to form the active layer 211. The active layer 211 may be formed of a silicon based semiconductor material or an oxide based semiconductor material.

Then, the gate insulating film 220 is formed on the active layer 211. The gate insulating film 220 may be formed of an inorganic film, for example, a silicon oxide film (SiOx), a silicon nitride film (SiNx) or a multi-layered film of the silicon oxide film and the silicon nitride film.

Then, the gate electrode 212 of the thin film transistor 210 is formed on the gate insulating film 220. Specifically, a first metal layer is formed on the entire surface of the gate insulating film 220 using a sputtering method or a MOVCD (metal organic chemical vapor deposition) method. Then, the first metal layer is patterned by a mask process using a photoresist pattern to form the gate electrode 212. The gate electrode 212 may be formed of a single layer or multi-layer comprised of any one of Mo, Al, Cr, Au, Ti, Ni, Nd and Cu or their alloy.

Then, the inter-layer dielectric film 230 is formed on the gate electrode 212. The inter-layer dielectric film 230 may be formed of an inorganic film, for example, a silicon oxide film (SiOx), a silicon nitride film (SiNx), or a multi-layered film of the silicon oxide film and the silicon nitride film.

Then, contact holes for exposing the active layer 211 by passing through the gate insulating film 220 and the inter-layer dielectric film 230 are formed.

Then, the source and drain electrodes 215 and 214 of the thin film transistor 210 are formed on the inter-layer dielectric film 230. Specifically, a second metal layer is formed on the entire surface of on the inter-layer dielectric film 230 using a sputtering method or a MOVCD (metal organic chemical vapor deposition) method. Then, the second metal layer is patterned by a mask process using a photoresist pattern to form the source and drain electrodes 215 and 214. Each of the source and drain electrodes 215 and 214 may be connected to the active layer 211 through contact holes that pass through the gate insulating film 220 and the inter-layer dielectric film 230. The source and the drain electrodes 215 and 214 may be formed of a single layer or multi-layer comprised of any one of Mo, Al, Cr, Au, Ti, Ni, Nd and Cu or their alloy.

Then, the passivation film 240 is formed on the source and drain electrodes 215 and 214 of the thin film transistor 210. The passivation film 240 may be formed of an inorganic film, for example, a silicon oxide film (SiOx), a silicon nitride film (SiNx), or a multi-layered film of the silicon oxide film and the silicon nitride film. The passivation film 240 may be formed using a CVD method.

Then, the planarization film 250 for planarizing a step difference due to the thin film transistor 210 is formed on the passivation layer 240. The planarization film 250 may be formed of an organic film such as acrylic resin, epoxy resin, phenolic resin, polyamide resin, and polyimide resin.

Then, the first electrode 261 of the organic light emitting device layer 260 is formed on the planarization film 250. In more detail, a third metal layer is formed on the entire surface of the planarization film 250 using a sputtering method or a MOVCD (Metal Organic Chemical Vapor Deposition) method. Then, the third metal layer is patterned by a mask process using a photoresist pattern to form the first electrode 261. The first electrode 261 may be connected to the source electrode 223 of the thin film transistor 220 through a contact hole that passes through the passivation film 240 and the planarization film 250. The first electrode 261 may be formed of a conductive material with high reflectivity such as a deposition structure (Ti/Al/Ti) of Al and Ti, a deposition structure (ITO/Al/ITO) of Al and ITO, an APC alloy, or a deposition structure (ITO/APC/ITO) of APC alloy and ITO.

Then, in order to partition the sub pixels SP, the bank 270 is formed on the planarization film 250 to cover an edge of the first electrode 261. The bank 270 may be formed of an organic film such as acrylic resin, epoxy resin, phenolic resin, polyamide resin, and polyimide resin.

Then, the light emitting layer 262 is formed on the first electrode 261 and the bank 270. The light emitting layer 262 may be an organic light emitting layer. In this case, the organic light emitting layer 262 is formed on the first electrode 261 and the bank 270 by a deposition process or solution process. The organic light emitting layer 262 may be a common layer commonly formed for pixels P1, P2, and P3. In this case, the organic light emitting layer 262 may be formed of a white light emitting layer for emitting white light.

If the organic light emitting layer 262 is a white light emitting layer, the organic light emitting layer 262 may be formed in a tandem structure of two stacks or more. Each of the stacks may include a hole transporting layer, at least one light emitting layer, and an electron transporting layer.

Also, a charge generating layer may be formed between the stacks. The charge generating layer may include an n type charge generating layer arranged to adjoin the lower stack, and a p type charge generating layer formed on the n type charge generating layer and arranged to adjoin the upper stack. The n type charge generating layer injects electrons into the lower stack, and the p type charge generating layer injects holes into the upper stack. The n type charge generating layer may be an organic layer of an organic host material doped with alkali metal such as Li, Na, K, or Cs, or alkali earth metal such as Mg, Sr, Ba or Ra, wherein the organic host material has electron transporting capability. The p type charge generating layer may be an organic layer of an organic host material doped with a dopant, wherein the organic host material has hole transportation capability.

Afterwards, the second electrode 263 is formed on the light emitting layer 262. The second electrode 263 may be a common layer commonly formed for the sub pixels SP. The second electrode 263 may be formed of a transparent conductive material (TCO) such as ITO and IZO, which may transmit light. The second electrode 263 may be formed by physics vapor deposition such as a sputtering method. A capping layer may be formed on the second electrode 263.

Afterwards, the encapsulation film 280 is formed on the second electrode 263. The encapsulation film 280 serves to prevent oxygen or water from being permeated into the light emitting layer 262 and the second electrode 263. To this end, the encapsulation film 280 may include at least one inorganic film 281 and 283. At least one inorganic film 281 and 283 may be formed of a silicon nitride, an aluminum nitride, a zirconium nitride, a titanium nitride, a hafnium nitride, a tantalum nitride, silicon oxide, an aluminum oxide, or a titanium oxide.

Also, the encapsulation film 280 may further include at least one organic film 282. The organic film 282 may be formed with a sufficient thickness to prevent particles from being permeated into the organic light emitting layer 262 and the second electrode 263 by passing through the encapsulation film 280.

Meanwhile, the process of forming at least one inorganic film 281 and 283 and the organic film 282 of the encapsulation film may be performed by a low temperature process of 100° C. or less to prevent the light emitting layer 262, which is already formed, from being damaged by a high temperature.

Figure 10:
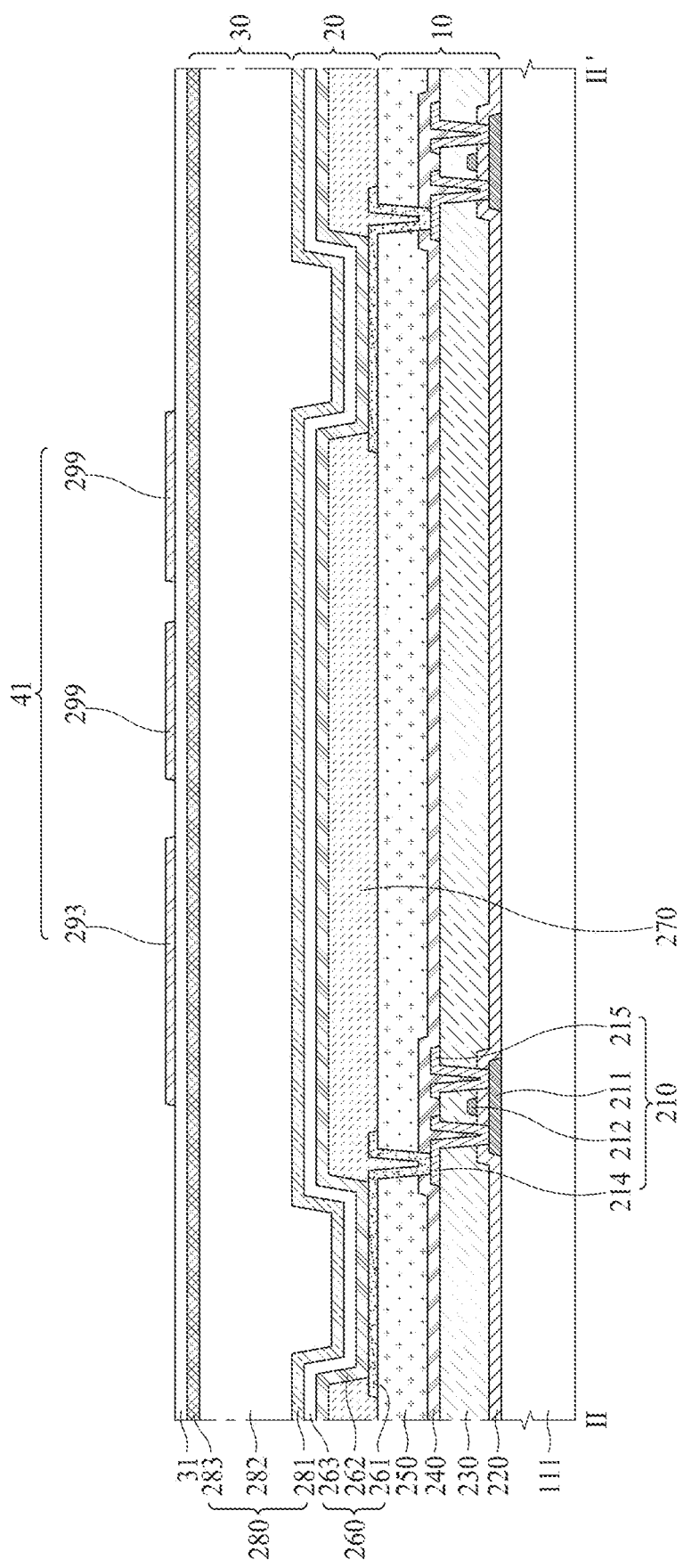

Secondly, as shown in FIG. 10, a second buffer film 31 is formed on the encapsulation layer 30. A first touch electrode layer 41 that includes the first bridge electrodes 293 and the second patterned touch electrodes 299 is patterned on the second buffer film 31 (S102 of FIG. 8).

In more detail, the second buffer film 31 may be formed to cover the encapsulation film 280 and the first and second touch pads TP and RP. The second buffer film 31 may be formed of an inorganic film or an organic film. If the second buffer film 31 is formed of an inorganic film, the second buffer film 31 may be formed of a silicon oxide film (SiOx), a silicon nitride film (SiNx) or a multi-layered film of the silicon oxide film and the silicon nitride film. If the second buffer film 31 is formed of an organic film, the second buffer film 31 may be plasma treated to form a rough surface. In this case, since an area of the second buffer film 31 which is in contact with the first bridge electrodes 293 and the second touch electrodes 299 of the first touch electrode layer 41 may be increased, surface adhesion between the second buffer film 31 and the first bridge electrodes 293 and the second touch electrodes 299 of the first touch electrode layer 41 may be enhanced. Meanwhile, the process of forming the buffer film 31 may be performed by a low temperature process of 100° C. or less to prevent the light emitting layer 262, which is already formed, from being damaged by a high temperature.

Afterwards, the first touch electrode layer 41 is formed on the entire surface of the second buffer film 31 using a sputtering method or a MOVCD (metal organic chemical vapor deposition) method. Then, the first touch electrode layer 41 is patterned by a mask process using a photoresist pattern to form the first bridge electrodes 293 and the second patterned touch electrodes 299. The first bridge electrodes 293 and the second touch electrodes 299 may be formed of a multi-layered structure that includes a plurality of electrodes, for example, a three-layered structure of Ti/Al/Ti.

One of patterns of the first bridge electrodes 293 and the second patterned touch electrodes 299 constituting the first touch electrode layer 41 may form Tx electrode or Rx electrode. Alternatively, the patterns of the plurality of first bridge electrodes 293 and the second touch electrodes 299 constituting the first touch electrode layer 41 may be connected with each other to form one Tx electrode or one Rx electrode.

If the first touch electrode layer 41 is patterned to form the first bridge electrode 293 and the second touch electrodes 299, the first bridge electrode 293 constituting the Tx electrode and the second patterned touch electrode 299 constituting the Rx electrode may be patterned to be spaced apart from each other.

Figure 11:
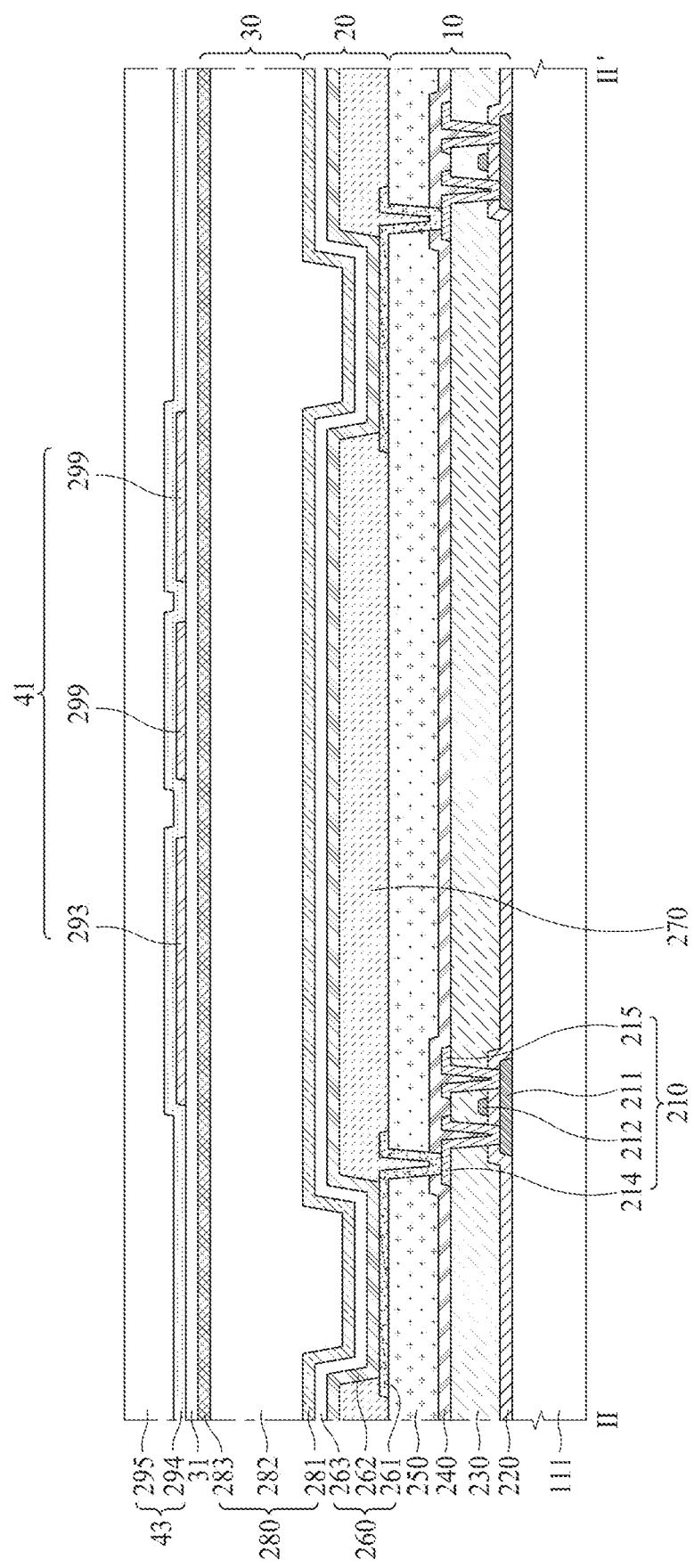

Thirdly, as shown in FIG. 11, the touch insulating film 43 that includes a touch inorganic film 294 and a touch organic film 295 is formed on the first touch electrode layer 41 (S103 of FIG. 8).

In more detail, the touch inorganic film 294 is formed on the first touch electrode layer 41. The touch inorganic film 294 may be formed of a silicon oxide film (SiOx), a silicon nitride film (SiNx) or a multi-layered film of the silicon oxide film and the silicon nitride film.

Then, the touch organic film 295 is formed on the touch inorganic film 294.

The organic film 282 of the encapsulation film 280 is a particle cover layer for preventing particles from being permeated into the light emitting layer 262 and the second electrode 263 by passing through the encapsulation film 280, whereas the touch organic film 295 is a layer for spacing the first touch electrode layer 41 and the second touch electrode layer 42 apart from each other at a predetermined distance. Therefore, the touch organic film 295 may be formed at a thickness thinner than that of the organic film 282 of the encapsulation film 280. For example, the touch organic film 295 may be formed at a thickness of 2 μm, approximately.

Since contact holes are not formed in the organic film 282 of the encapsulation film 280, the organic film 282 of the encapsulation film 280 does not need to include a photoresist material. By contrast, since contact holes are formed in the touch organic film 295, the touch organic film 295 may include a photoresist material. For example, the touch organic film 295 may be formed of a photo acrylate that includes a photoresist material.

Meanwhile, the process of forming the touch inorganic film 294 and the touch organic film 295 may be performed by a low temperature process of 100° C. or less to prevent the light emitting layer 262, which is already formed, from being damaged by a high temperature.

Figure 12:
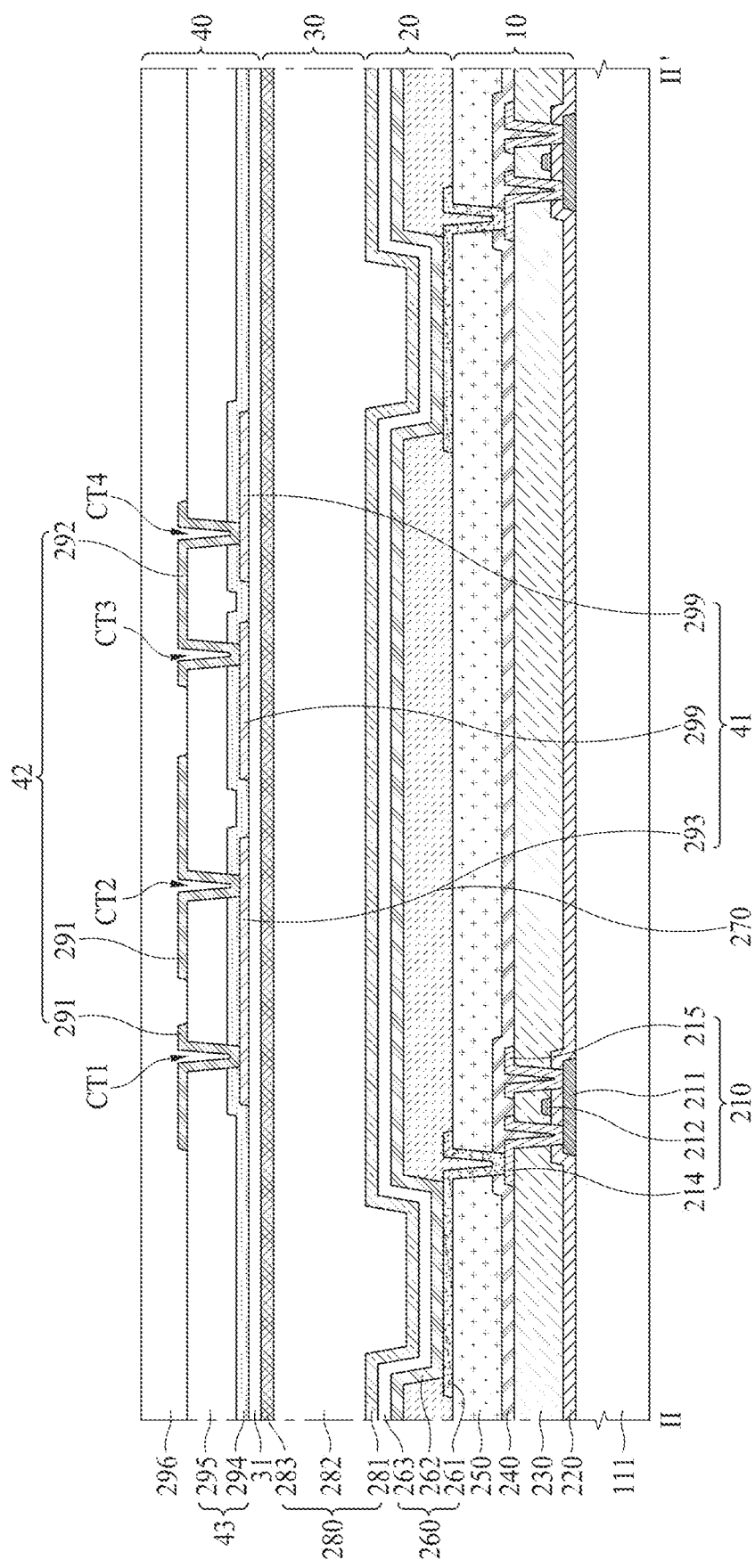

Fourthly, as shown in FIG. 12, a plurality of contact holes CT1 to CT4 passing through the touch insulating film 43 are formed, and the second touch electrode layer 42 that includes first patterned touch electrodes 291 and second bridge electrodes 292 is formed on the touch insulating film 43 (S104 of FIG. 8).

When the plurality of contact holes CT1 to CT4 are formed, first connectors are formed, which includes first to fourth contact holes CT1 to CT4 for exposing the first bridge electrodes 293 and the second touch electrodes 299 by passing through the touch inorganic film 294 and the touch organic film 295, which constitute the touch insulating film 43. Simultaneously, second connectors CNT2 for exposing the first touch pads TP by passing through the passivation film 240 and the buffer film 31 are formed, and third connectors CNT3 for exposing the second touch pads RP by passing through the passivation film 240 and the buffer film 31 are formed.

When the second touch electrode layer 42 is formed, the first patterned touch electrodes 291 and the second bridge electrodes 292 are formed on the entire surface of the touch insulating film 43 using a sputtering method or MOCVD method. Each of the first patterned touch electrodes 291 may be connected with the first bridge electrodes 293 through the first connector that passes through the touch inorganic film 294 and the touch organic film 295. The first patterned touch electrodes 291 and the second bridge electrodes 292 may be formed in a multi-layered structure that includes a plurality of electrodes, for example, a three-layered structure of Ti/Al/Ti.

The first touch line TL may be extended from the first patterned touch electrode 291, and the second touch line RL may be extended from the second bridge electrode 292. The first touch line TL may be connected with the first touch pad TP through the second connector CNT2 that passes through the passivation film 240 and the buffer film 31. The second touch line RL may be connected with the second touch pad RP through the third connector CNT3 that passes through the passivation film 240 and the buffer film 31.

The first patterned touch electrodes 291, the second bridge electrodes 292, the first touch lines TL and the second touch lines RL may be formed of a single layer or multi-layer comprised of any one of Mo, Al, Cr, Au, Ti, Ni, Nd and Cu or their alloy.

The first patterned touch electrodes 291 are connected with the first bridge electrodes 293 through the first and second contact holes CT1 and CT2. The first patterned touch electrodes 291 are connected with the first bridge electrodes 293 to form one Tx electrode. The second bridge electrodes 292 are connected with the second patterned touch electrodes 299 through the third and fourth contact holes CT3 and CT4. The second bridge electrodes 292 are connected with the second patterned touch electrodes 299 to form one Rx electrode.

The first patterned touch electrode 291 and the second bridge electrode 292 are arranged to be spaced apart from each other. The first patterned touch electrode 291 constituting the Tx electrode and the second bridge electrode 292 constituting the Rx electrode are arranged on the same layer. If the first patterned touch electrode 291 and the second bridge electrode 292, which are arranged on the same layer, are adjacent to each other, signal interference between the Tx electrode and the Rx electrode may be generated, and parasitic capacitance may be generated between the Tx electrode and the Rx electrode. Therefore, if the first patterned touch electrode 291 and the second bridge electrode 292 are spaced apart from each other, signal interference and parasitic capacitance may be avoided.

The first bridge electrode 293 connected with the first patterned touch electrode 291 and the second patterned touch electrode 293 connected with the second bridge electrode 292 are arranged to be spaced apart from each other. The first bridge electrode 293 constituting the Tx electrode and the second patterned touch electrode 299 constituting the Rx electrode are arranged on the same layer. Therefore, the first bridge electrode 293 connected with the first patterned touch electrode 291 and the second patterned touch electrode 299 connected with the second bridge electrode 292 are arranged on the same layer. If the first bridge electrode 293 connected with the first patterned touch electrode 291 and the second touch electrode 299 connected with the second bridge electrode 292, which are arranged on the same layer, are adjacent to each other, signal interference between the Tx electrode and the Rx electrode may be generated, and parasitic capacitance may be generated between the Tx electrode and the Rx electrode. Therefore, the first bridge electrode 293 constituting the Tx electrode and the second patterned touch electrode 299 constituting the Rx electrode are spaced apart from each other, whereby signal interference and parasitic capacitance may be avoided.

FIG. 12 illustrates that the first patterned touch electrode 291 is formed of two patterns and the first bridge electrode 293 for connecting the first patterned touch electrodes 291 with each other is formed of one pattern. Also, FIG. 12 illustrates that the second patterned touch electrode 299 connected with one second bridge electrode 292 is formed of two patterns.

The first patterned touch electrode 291 is formed on the same layer as that of the second bridge electrode 292, whereas the first patterned touch electrode 291 is formed on a layer different from that of the second patterned touch electrode 299. Therefore, if the distance between the first patterned touch electrode 291 and the second bridge electrode 292 is short, it is more affected by signal interference and parasitic capacitance. If the distance between the first patterned touch electrode 291 and the second patterned touch electrode 299, which are formed on their respective layers different from each other, becomes relatively short, this case may reduce signal interference or parasitic capacitance as compared with the case that the first patterned touch electrode 291 and the second bridge electrode 292 are formed of a single layer.

An overcoat layer 296 for planarizing a step difference caused by the first patterned touch electrodes 291, the second bridge electrodes 292, the first bridge electrodes 293, and the second patterned touch electrodes 299 may be formed on the first patterned touch electrodes 291 and the second bridge electrodes 292.

As described above, the display apparatus with an integrated touch screen and the method for fabricating the same according to the present disclosure have advantages as follows.

A short between the first patterned touch electrodes and the second bridge electrodes may be prevented from occurring.

In the present disclosure, to prevent a short between the first patterned touch electrodes and the second bridge electrodes from occurring, the Tx electrode is formed using the first bridge electrode which is the first touch electrode layer and the first patterned touch electrodes which are the second touch electrode layers, and the Rx electrode is formed using the second patterned touch electrodes which are the first touch electrode layer and the second bridge electrodes which are the second touch electrode layers. That is, since the Tx electrode and the Rx electrode are formed using a two-layered structure, the interval between the Tx electrode and the Rx electrode is increased based on the same layer, whereby occurrence of short is reduced.

Also, since the lower layer of the patterns corresponding to the Tx electrode and the Rx electrode is formed using the first bridge electrode and the second patterned touch electrode, and the contact hole is additionally provided in the touch insulating film, it is not required to add a separate layer or add a process or a mask during the fabricating process.

The following non-exhaustive list of embodiments form part of the disclosure. The following embodiments may be combined in any suitable combination, or may be combined with any other features detailed in the specification, which would be understood by the skilled person. In the below embodiments, it is noted that the second touch electrode (below) is a second bridge electrode (as defined above in some embodiments), and the other pattern of the bridge electrode (below) is a second patterned touch electrode (as defined above in some embodiments).

Embodiment 1

A display apparatus comprising:
a light emitting device layer that includes a first electrode arranged on a first substrate, a light emitting layer arranged on the first electrode, and a second electrode arranged on the light emitting layer; and
a touch sensing layer arranged on the light emitting device layer,
wherein the touch sensing layer includes first and second touch electrode layers and a touch insulating film arranged between the first and second touch electrode layers, and
the first touch electrode layer constitutes patterned bridge electrodes, the second touch electrode layer constitutes first and second touch electrodes, the first touch electrode and one pattern of the bridge electrodes are connected with each other to form one Tx electrode, and the second touch electrode and the other pattern of the bridge electrodes are connected with each other to form one Rx electrode.

Embodiment 2

The display apparatus of embodiment 1, wherein the first touch electrode and the second touch electrode are spaced from each other.

Embodiment 3

The display apparatus of embodiment 1, wherein one pattern of the bridge electrode connected with the first touch electrode and the other pattern of the bridge electrode connected with the second touch electrode are spaced from each other.

Embodiment 4

The display apparatus of embodiment 1, wherein, if the first touch electrode or the second touch electrode is patterned in a plurality of patterns, the bridge electrode connected with the first touch electrode or the second touch electrode is one pattern.

Embodiment 5

The display apparatus of embodiment 1, wherein, if the first touch electrode or the second touch electrode is one pattern, the bridge electrode connected with the first touch electrode or the second touch electrode is patterned in a plurality of patterns.

Embodiment 6

The display apparatus of embodiment 1, wherein a distance between the first touch electrode constituting the Tx electrode and the bridge electrode constituting the Rx electrode is shorter than a distance between the first touch electrode constituting the Tx electrode and the second touch electrode constituting the Rx electrode.

Embodiment 7

The display apparatus of embodiment 1, further comprising a first touch line extended from the first touch electrode, and a second touch line extended from the second touch electrode, wherein the first touch line is connected to a first touch pad through a second connector provided on the first substrate, and the second touch line is connected to a second touch pad through a third connector provided on the first substrate.

Embodiment 8

A method for fabricating a display apparatus, the method comprising the steps of:
forming a thin film transistor layer, a light emitting device layer, and an encapsulation layer on a first substrate;
patterning a first touch electrode layer, which includes bridge electrodes, on the encapsulation layer;
forming a touch insulating film, which includes a touch inorganic film and a touch organic film, on the first touch electrode layer; and
providing a plurality of contact holes in the touch insulating film and forming a second touch electrode layer, which includes first touch electrodes and second touch electrodes.

Embodiment 9

The method of embodiment 8, wherein the first touch electrode and the second touch electrode are spaced from each other.

Embodiment 10

The method of embodiment 8, wherein one pattern of the bridge electrode connected with the first touch electrode and the other pattern of the bridge electrode connected with the second touch electrode are spaced from each other.

Embodiment 11

The method of embodiment 8, wherein, if the first touch electrode or the second touch electrode is patterned in a plurality of patterns, the bridge electrode connected with the first touch electrode or the second touch electrode is one pattern.

Embodiment 12

The method of embodiment 8, wherein, if the first touch electrode or the second touch electrode is one pattern, the bridge electrode connected with the first touch electrode or the second touch electrode is patterned in a plurality of patterns.

Embodiment 13

The method of embodiment 1, wherein a distance between the first touch electrode constituting the Tx electrode and the bridge electrode constituting the Rx electrode is shorter than a distance between the first touch electrode constituting the Tx electrode and the second touch electrode constituting the Rx electrode.

It will be apparent to those skilled in the art that various modifications and variations can be made in the present disclosure without departing from the scope of the disclosures. Thus, it is intended that the present disclosure covers the modifications and variations of this disclosure provided they come within the scope of the appended claims.

What is claimed is:

1. A display apparatus comprising:
a light emitting device layer that includes a first electrode arranged on a first substrate, a light emitting layer arranged on the first electrode, and a second electrode arranged on the light emitting layer;
an encapsulation layer on the light emitting device layer; and
a touch sensing layer arranged on the encapsulation layer,
wherein the touch sensing layer includes a first touch electrode layer, a second touch electrode layer, and a touch insulating film arranged between the first and second touch electrode layers,
wherein the first touch electrode layer comprises a first bridge electrode and a second patterned touch electrode, and the second touch electrode layer comprises a first patterned touch electrode and a second bridge electrode,
wherein the first patterned touch electrode and the first bridge electrode are connected with each other to form a transmitting electrode, the transmitting electrode receiving a touch driving signal from a touch driver, the touch driving signal for sensing a touch,
wherein the second patterned touch electrode and the second bridge electrode are connected with each other to form a receiving electrode, the receiving electrode providing a touch sensing signal based on the touch driving signal to the touch driver,
wherein the second patterned touch electrode and the first bridge electrode are disposed on a layer different from that of the first patterned touch electrode and the second bridge electrode,
wherein the first patterned touch electrode is disposed on a same layer as that of the second bridge electrode, and the second patterned touch electrode is disposed on a same layer as that of the first bridge electrode, and wherein a closest distance between the first patterned touch electrode and the second patterned touch electrode, which are disposed on layers different from each other, is shorter than a closest distance between the first patterned touch electrode and the second bridge electrode, which are disposed on the same layer.

2. The display apparatus of claim 1, further comprising a touch buffer film disposed on the encapsulation layer.

3. The display apparatus of claim 2, wherein the touch insulating film is disposed on the touch buffer film.

4. The display apparatus of claim 3, wherein the touch insulating film comprises a touch organic layer and a touch inorganic layer.

5. The display apparatus of claim 3, wherein the first patterned touch electrode is connected to the first bridge electrode through at least one first contact hole, the first contact hole penetrating the touch insulating film.

6. The display apparatus of claim 3, wherein the second patterned touch electrode is connected to the second bridge electrode through at least one second contact hole, the second contact hole penetrating the touch insulating film.

7. The display apparatus of claim 1, wherein the first patterned touch electrode and the second bridge electrode are spaced from each other in the second touch electrode layer.

8. The display apparatus of claim 1, wherein the first bridge electrode connected with the first patterned touch electrode and the second patterned touch electrode connected with the second bridge electrode are spaced from each other in the first touch electrode layer.

9. The display apparatus of claim 1, wherein the first patterned touch electrode constitutes the transmitting electrode, the second patterned touch electrode constitutes the receiving electrode, and the second bridge electrode constitutes the receiving electrode.

10. The display apparatus of claim 1, further comprising a first touch line extended from the first patterned touch electrode, and a second touch line extended from the second patterned touch electrode, wherein the first touch line is electrically connected to a first touch pad through a first connector provided on the first substrate, and the second touch line is electrically connected to a second touch pad through a second connector provided on the first substrate.

11. The display apparatus of claim 1, wherein the receiving electrode and the transmitting electrode in the touch sensing layer are arranged in a form of a mesh.

12. The display apparatus of claim 1, wherein the closest distance between the first patterned touch electrode and the second patterned touch electrode is a distance on a plane of the display apparatus and the closest distance between the first patterned touch electrode and the second bridge electrode is a distance on the plane of the display apparatus.

13. The display apparatus of claim 1, wherein the first patterned touch electrode overlaps with the second patterned touch electrode.

14. A method for fabricating a display apparatus, the method comprising:

forming a thin film transistor layer, a light emitting device layer, and an encapsulation layer on a first substrate;

patterning a first touch electrode layer on the encapsulation layer, wherein the first touch electrode layer includes first bridge electrodes and second patterned touch electrodes;

forming a touch insulating film, which includes a touch inorganic film and a touch organic film, on the first touch electrode layer; and providing a plurality of contact holes in the touch insulating film and forming a second touch electrode layer, which includes first patterned touch electrodes and second bridge electrodes, wherein a first patterned touch electrode from the first patterned touch electrodes and a first bridge electrode from the first bridge electrodes are connected with each other to form a transmitting electrode, the transmitting electrode configured to receive a touch driving signal from a touch driver, the touch driving signal for sensing a touch, wherein a second patterned touch electrode from the second patterned touch electrodes and a second bridge electrode from the second bridge electrodes are connected with each other to form a receiving electrode, the receiving electrode configured to provide a touch sensing signal based on the touch driving signal to the touch driver, wherein the second patterned touch electrodes are formed on a layer different from that of the first patterned touch electrodes, and the first patterned touch electrodes are formed on a same layer as that of the second bridge electrodes, and wherein a closest distance between the first patterned touch electrode and the second patterned touch electrode is shorter than a closest distance between the first patterned touch electrode and the second bridge electrode.

15. The method of claim 14, wherein each of the first patterned touch electrodes and each of the second bridge electrode are spaced from each other in the second touch electrode layer.

16. The method of claim 14, wherein each of the first bridge electrodes and each of the second patterned touch electrodes are spaced from each other in the first touch electrode layer.

17. The method of claim 14, wherein the first patterned touch electrode constitutes the transmitting electrode, the second patterned touch electrode constitutes the receiving electrode, and the second bridge electrode constitutes the receiving electrode.

18. The method of claim 14, wherein the first bridge electrode is on a same layer as the second patterned touch electrode, and the second bridge electrode is on a different layer than the first bridge electrode.

* * * * *